US012645331B2

(12) United States Patent
Lee et al.

(10) Patent No.: US 12,645,331 B2
(45) Date of Patent: Jun. 2, 2026

(54) ELECTRONIC DEVICE WITH MESH PATTERN INCLUDING PROTECTIVE PATTERN

(71) Applicant: SAMSUNG DISPLAY CO., LTD., Yongin-si (KR)

(72) Inventors: Dongmin Lee, Yongin-si (KR); Joon Woo Bae, Yongin-si (KR); Samtae Jeong, Yongin-si (KR); Hyuneok Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/754,663

(22) Filed: Jun. 26, 2024

(65) Prior Publication Data

US 2025/0103170 A1     Mar. 27, 2025

(30) Foreign Application Priority Data

Sep. 21, 2023     (KR) .......................... 10-2023-0126426

(51) Int. Cl.
*G06F 3/044*     (2006.01)
*H10K 59/40*     (2023.01)

(52) U.S. Cl.
CPC .......... *G06F 3/0446* (2019.05); *G06F 3/0445* (2019.05); *H10K 59/40* (2023.02); *G06F 2203/04103* (2013.01); *G06F 2203/04112* (2013.01)

(58) Field of Classification Search
CPC .. G06F 3/0412; G06F 3/04164; G06F 3/0445; G06F 3/0446; G06F 2203/04103; G06F 2203/04112; H10K 59/40
See application file for complete search history.

(56) References Cited

U.S. PATENT DOCUMENTS

| | | | |
|---|---|---|---|
| 10,168,844 B2 | 1/2019 | Kwon et al. | |
| 11,211,582 B2 | 12/2021 | Kim et al. | |
| 11,422,654 B2 | 8/2022 | Choi et al. | |
| 2015/0253810 A1* | 9/2015 | Shin ...................... | G06F 3/0445 |
| | | | 345/174 |

(Continued)

FOREIGN PATENT DOCUMENTS

| | | |
|---|---|---|
| EP | 4047462 A1 | 8/2022 |
| KR | 10-2017-0086159 A | 7/2017 |

(Continued)

*Primary Examiner* — Liliana Cerullo
(74) *Attorney, Agent, or Firm* — F. CHAU & ASSOCIATES, LLC

(57) ABSTRACT

An electronic device includes a display panel and an input sensor. The input sensor includes first and second insulating layers, a first sensor electrode including first sensor patterns and first connection patterns, and a second sensor electrode including second sensor patterns and second connection patterns. Each of the first sensor electrode and the second sensor electrode may include a mesh pattern. The mesh pattern includes a first layer, a second layer, a third layer, and a protective pattern covering the side surface of the second layer. An inner surface of the protective pattern directly contacts the side surface of the second layer. The tip part of the third layer and an outer surface of the protective pattern have an undercut shape in a cross-sectional view.

17 Claims, 14 Drawing Sheets

(56)     References Cited

U.S. PATENT DOCUMENTS

| | | |
|---|---|---|
| 2016/0070033 A1 | 3/2016 | Schlott et al. |
| 2016/0203960 A1 | 7/2016 | Sun et al. |
| 2019/0004616 A1* | 1/2019 | Baek .................... H04M 1/233 |
| 2019/0171318 A1* | 6/2019 | Ryu .................... H10K 50/844 |
| 2021/0066559 A1* | 3/2021 | Zhang ................ H01L 25/0753 |
| 2022/0050542 A1* | 2/2022 | Choi .................... G06F 3/0446 |
| 2022/0238606 A1 | 7/2022 | Jeong et al. |
| 2023/0180563 A1* | 6/2023 | Xu ....................... H10D 86/411 |
| | | 257/40 |

FOREIGN PATENT DOCUMENTS

| | | | |
|---|---|---|---|
| KR | 10-2022-0021055 | A | 2/2022 |
| KR | 10-2022-0109548 | A | 8/2022 |
| KR | 10-2438934 | B1 | 9/2022 |

* cited by examiner

ELECTRONIC DEVICE WITH MESH PATTERN INCLUDING PROTECTIVE PATTERN

CROSS-REFERENCE TO RELATED APPLICATIONS

This application claims priority under 35 U.S.C. § 119 to Korean Patent Application No. 10-2023-0126426, filed on Sep. 21, 2023 in the Korean Intellectual Property Office, the disclosure of which is incorporated by reference in its entirety herein.

TECHNICAL FIELD

Embodiments of the present disclosure described herein relate to an electronic device and a method for manufacturing the same, and more particularly, relate to an electronic device including an input sensor and a method for manufacturing the same.

DISCUSSION OF RELATED ART

Various multimedia electronic devices, such as a television (TV), a cellular phone, a tablet computer, a navigation system, and a game console, may provide a touch-based input manner for enabling a user to intuitively, conveniently, and easily input information or a command, while at least one image is generated on a display screen. The electronic device may include a display panel to generate the images and an input sensor to sense the touch of the touch of the user.

The input sensor to sense the touch of the user may include a conductive layer to transmit a signal. The conductive layer may include signal patterns and connection patterns. The signal patterns and the connection patterns to transmit the signal may have a thickness that is sufficient to ensure the reliability of the signal transmission. However, the signal patterns and the connection patterns may be viewable by the user as light is reflected from the side surface, depending on the thicknesses of the signal patterns and the connection patterns.

SUMMARY

Embodiments of the present disclosure provide an electronic device preventing the viewing of a mesh pattern by the user.

Embodiments of the present disclosure may provide an electronic device preventing light from being reflected from the side surface of the conductive pattern by disposing a protective pattern on the side surface of the conductive pattern.

Embodiments of the present disclosure may provide a method for manufacturing an electronic device allowing the patterning of a protective pattern without adding a mask by disconnecting a portion of the protective pattern by a tip part of the conductive pattern.

According to an embodiment of the present disclosure, an electronic device includes a display panel. An input sensor includes a first insulating layer directly contacting the display panel. A second insulating layer is disposed on the first insulating layer. A first sensor electrode includes a plurality of first sensor patterns and a plurality of first connection patterns connecting the first sensor patterns to each other. A second sensor electrode includes a plurality of second sensor patterns and a plurality of second connection patterns connecting the second sensor patterns to each other. The first connection patterns and the second connection patterns are arranged to be spaced apart from each other with the second insulating layer interposed between the first connection patterns and the second connection patterns. Each of the first sensor electrode and the second sensor electrode includes a mesh pattern. The mesh pattern includes a first layer. A second layer is disposed on the first layer and has electrical conductivity. A third layer is disposed on the second layer. The third layer has a tip part protruding beyond a side surface of the second layer in a cross-sectional view. A protective pattern covers the side surface of the second layer, and has an inner surface directly contacting the side surface of the second layer and an outer surface opposite to the inner surface. The tip part and the outer surface of the protective pattern have an undercut form in a cross-sectional view.

In an embodiment, the protective pattern may have a reflectance that is less than a reflectance of the second layer.

In an embodiment, the protective pattern may include a first protective pattern layer directly contacting the side surface of the second layer, and a second protective pattern layer covering the first protective pattern layer. The second protective pattern layer includes a material different from a material of the first protective pattern layer.

In an embodiment, the first protective pattern layer may include molybdenum and tantalum, and the second protective pattern layer may include silicon oxide, silicon nitride, silicon oxynitride, or amorphous silicon.

In an embodiment, the first protective pattern layer may have a minimum thickness value greater than or equal to about 300 Å.

In an embodiment, the protective pattern may have an uneven thickness along the side surface of the second layer.

In an embodiment, the second layer may have a tapered form in a cross-sectional view. A tapered angle of the second layer may be in a range of about 60 degrees to about 90 degrees.

In an embodiment, the first insulating layer may include silicon oxide or silicon nitride.

In an embodiment, the first sensor patterns and the second sensor patterns may be disposed on a same layer as the first connection patterns.

In an embodiment, the first connection patterns may be disposed on the second insulating layer, and the second connection patterns may be interposed between the first insulating layer and the second insulating layer.

In an embodiment, the mesh pattern includes a plurality of mesh patterns. The plurality of mesh patterns may include a first mesh pattern and a second mesh pattern spaced apart from each other in a plan view. The first mesh pattern and the second mesh pattern may include edges defining a minimum distance between the first mesh pattern and the second mesh pattern. The plurality of protective patterns may be disposed on the plurality of edges.

In an embodiment, the second layer may include aluminum (Al), and the third layer may include titanium (Ti).

According to an embodiment of the present disclosure, an electronic device includes a display panel. An input sensor includes a first insulating layer directly contacting the display panel. A second insulating layer is disposed on the first insulating layer. A first sensor electrode includes a plurality of first sensor patterns and a plurality of first connection patterns connecting the first sensor patterns to each other. A second sensor electrode including a plurality of second sensor patterns and a plurality of second connection patterns connecting the second sensor patterns to each other. The first connection patterns and the second connection patterns are arranged to be spaced apart from each other with the second insulating layer interposed between the first connection patterns and the second connection patterns. Each of the first sensor electrode and the second sensor electrode includes a mesh pattern. The mesh pattern includes a first layer. A second layer is disposed on the first layer and has electrical conductivity. A third layer is disposed on the second layer and includes a material different from a material of the second layer. A protective pattern covers a side surface of the second layer. The protective pattern has an inner surface directly contacting the side surface of the second layer and an outer surface opposite to the inner surface. The protective pattern includes a first protective pattern layer directly contacting the side surface of the second layer and having a reflectance less than a reflectance of the second layer. A second protective pattern layer covers the first protective pattern layer. The second protective pattern layer includes a material different from a material of the first protective pattern layer.

In an embodiment, the third layer may have a tip part protruding beyond the side surface of the second layer in a cross-sectional view, and a side surface of the third layer and the outer surface of the protective pattern may have an undercut form in a cross-sectional view.

In an embodiment, the second layer may include aluminum (Al), and the third layer may include titanium (Ti).

In an embodiment, the first protective pattern layer may include molybdenum and tantalum, and the second protective pattern layer may include silicon oxide, silicon nitride, silicon oxynitride, or amorphous silicon.

In an embodiment, the first protective pattern layer may have a minimum width value greater than or equal to about 300 Å.

According to an embodiment of the present disclosure, a method for manufacturing an electronic device, may include performing a first etching that forms a preliminary conductive pattern including a first layer, a second layer, and a third layer sequentially formed on an insulating layer. A second etching is performed that forms an undercut in the second layer to form a conductive pattern having a tip part in the third layer. A preliminary protective pattern is formed covering the conductive pattern. A third etching is performed that forms a protective pattern covering a side surface of the second layer by removing a portion of the preliminary protective pattern. A first part of the preliminary protective pattern that covers the third layer, and a second part of the preliminary protective pattern that covers the side surface of the second layer, may be formed to be disconnected from each other by the tip part, in the forming of the preliminary protective pattern. At least a portion of the second part covering the side surface of the second layer may be blocked from being etched by the tip part in the third etching.

In an embodiment, during the forming of the conductive pattern, the second layer may be etched to have a tapered form having a tapered angle in a range of about 60 degrees to about 90 degrees in a cross-sectional view.

In an embodiment, the forming of the preliminary protective pattern may include forming a first preliminary protective pattern layer covering the conductive pattern and including a material having a reflectance that is less than a reflectance of the second layer, and forming a second preliminary protective pattern layer covering the first preliminary protective pattern layer, the second preliminary protective pattern layer including a material different from a material of the first preliminary protective pattern layer.

BRIEF DESCRIPTION OF THE DRAWINGS

The above and other objects and features of the present disclosure will become apparent by describing in detail non-limiting embodiments thereof with reference to the accompanying drawings.

DETAILED DESCRIPTION OF EMBODIMENTS

Figure 1:
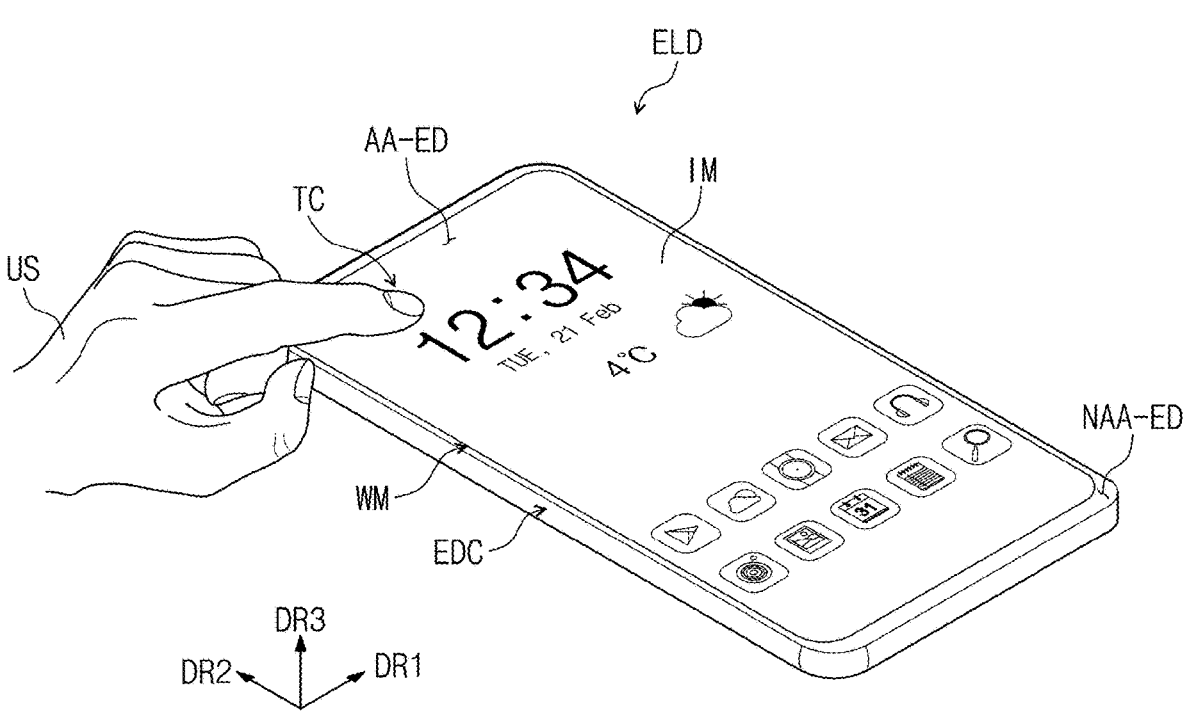
FIG. 1 is a perspective view of an electronic device according to an embodiment of the present disclosure.

In the specification, the expression that a first component (or region, layer, part, portion, etc.) is "on", "connected to", or "coupled to" a second component means that the first component is directly on, connected to, or coupled to the second component or means that a third component is interposed therebetween. In contrast, the expression that a first component (or region, layer, part, portion, etc.) is "directly on", "directly connected to", or "directly coupled to" means that no intervening components are disposed therebetween.

The same reference numeral will be assigned to the same component. In addition, in drawings, thicknesses, proportions, and dimensions of components may be exaggerated to describe the technical features effectively. The term "and/or" includes any and all combinations of one or more of associated components Although the terms "first", "second", etc. may be used to describe various components, the components should not be construed as being limited by the terms. The terms are only used to distinguish one component from another component. For example, without departing from the scope and spirit of embodiments of the present disclosure, a first component may be referred to as a second component, and similarly, the second component may be referred to as the first component.

The singular forms are intended to include the plural forms unless the context clearly indicates otherwise.

In addition, the terms "under", "at a lower portion", "above", "an upper portion" are used to describe the relationship between components illustrated in drawings. The terms are relative and are described with reference to a direction indicated in the drawing.

It will be further understood that the terms "comprises," "comprising," "includes," "including," or "having" specify the presence of stated features, numbers, steps, operations, components, parts, or the combination thereof, but do not preclude the presence or addition of one or more other features, numbers, steps, operations, components, components, and/or the combination thereof.

Unless otherwise defined, all terms (including technical terms and scientific terms) used in the specification have the same meaning as commonly understood by one skilled in the art to which embodiments of the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, an electronic device according to an embodiment of the present disclosure and a method for manufacturing the same will be described with reference to accompanying drawings.

Figure 2:
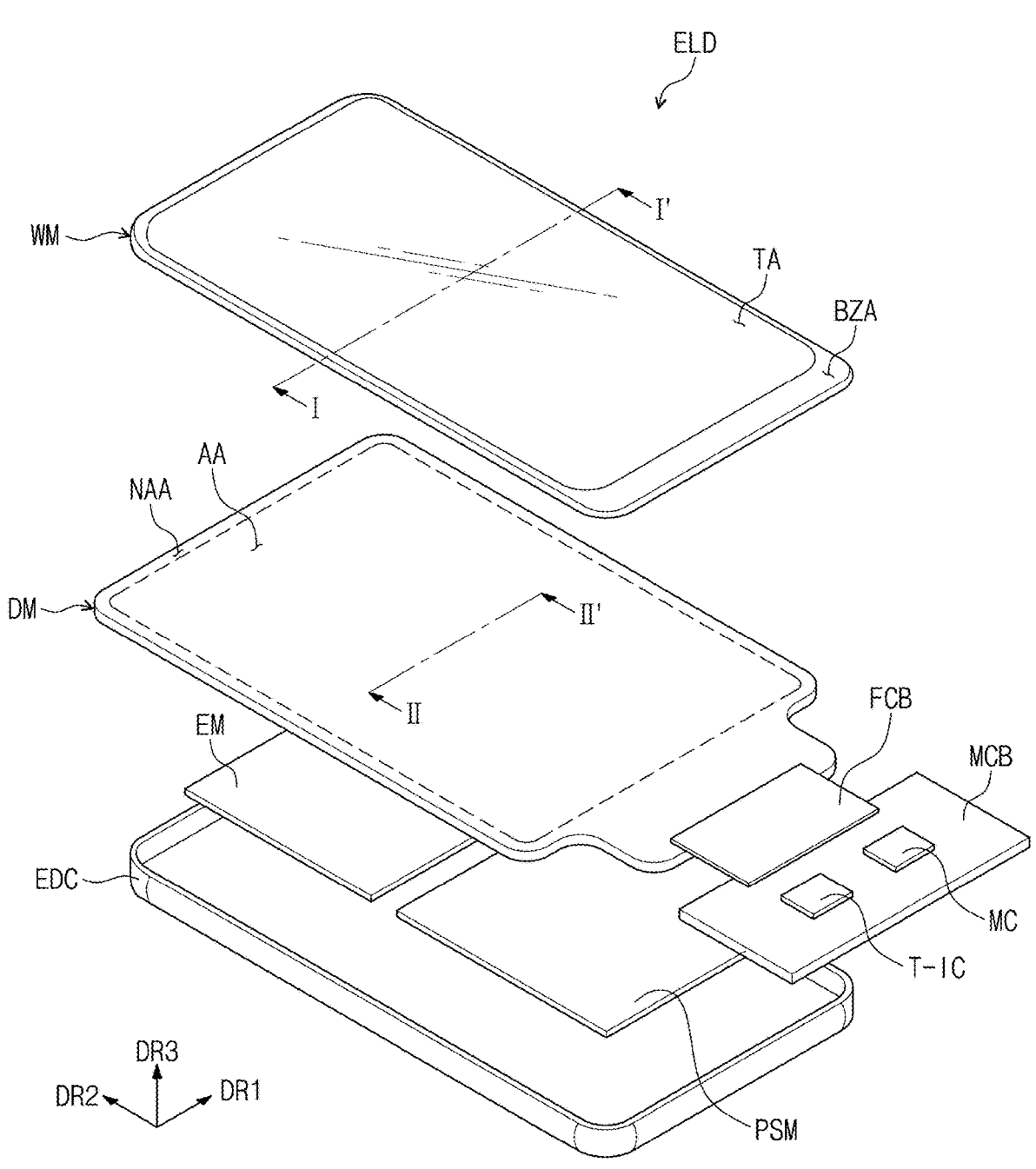
FIG. 2 is an exploded perspective view of an electronic device according to an embodiment of the present disclosure.
Figure 3:
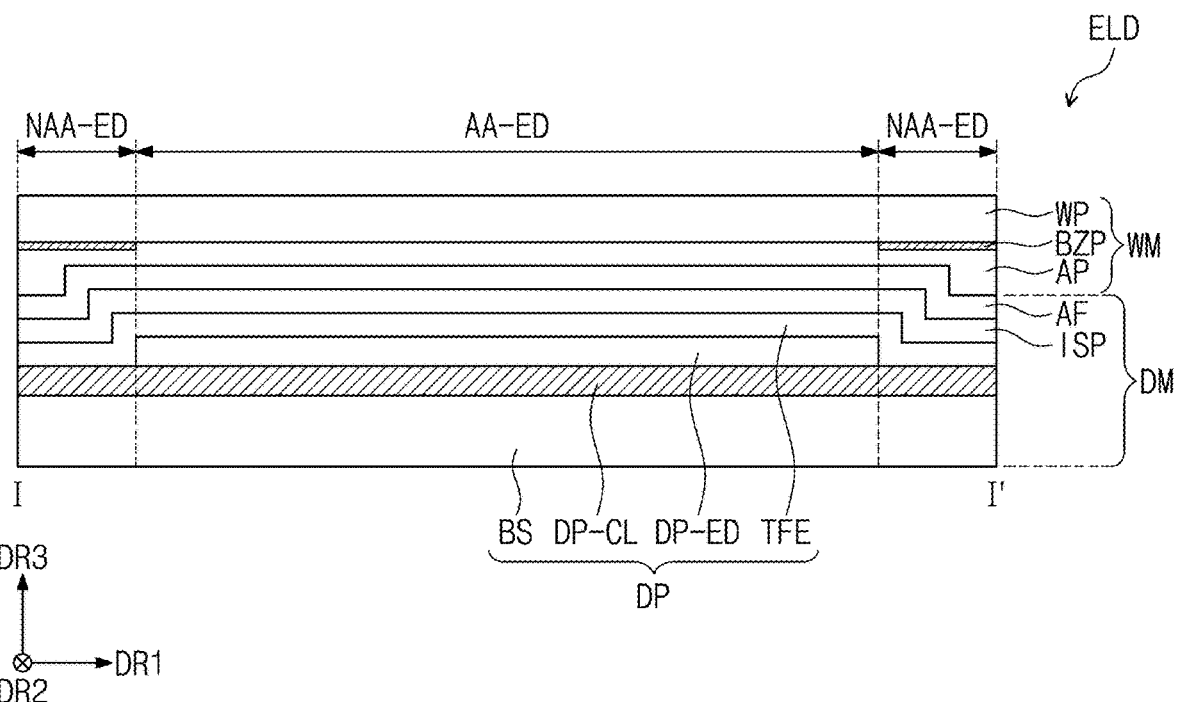
FIG. 3 is an enlarged cross-sectional view illustrating a portion of an electronic device according to an embodiment of the present disclosure.

FIG. 1 is a perspective view illustrating an electronic device according to an embodiment of the present disclosure, FIG. 2 is an exploded perspective view illustrating an electronic device according to an embodiment of the present disclosure, and FIG. 3 is an enlarged cross-sectional view illustrating a portion of an electronic device according to an embodiment of the present disclosure. FIG. 3 is a cross-sectional view illustrating a portion corresponding to line taken along line I-I' of FIG. 2.

Referring to FIG. 1, an electronic device ELD may be a device activated in response to an electrical signal to display an image. According to an embodiment, the electronic device ELD may be a small-sized and medium-sized electronic device, such as a monitor, a cellular phone, a tablet PC, a navigation, a game console, or the like, as well as a large-sized electronic device, such as a television, or an external billboard. However, embodiments of the electronic device ELD are provided only for the illustrative purpose, and the electronic device ELD is not necessarily limited to any one embodiment unless departing from the scope and spirit of the present disclosure.

The electronic device ELD may be rigid or flexible. The term "flexible" refers to a bendable characteristic. For example, the flexible electronic device ELD may include a curved electronic device, a rollable electronic device, a foldable electronic device or an otherwise deformable electronic device.

FIG. 1 and drawings thereafter illustrate a first to third direction axes DR1, DR2, and DR3 and directions indicated by the first to third direction axes DR1, DR2, and DR3 described in this specification may be relative concepts and may be converted into other directions. In addition, the directions indicated by the first to third direction axes DR1, DR2, and DR3 will be referred to as first to third directions DR1, DR2, and DR3 and will be assigned with the same reference numerals as the first to third directions DR1, DR2, and DR3. In an embodiment, the first directional axis DR1 and the second directional axis DR2 may be perpendicular to each other. However, embodiments of the present disclosure are not necessarily limited thereto and the first and second directional axes DR1, DR2 may cross each other at various different angles. The third directional axis DR3 may be a direction normal to the plane defined by the first direction axis DR1 and the second direction axis DR2.

The thickness direction of the electronic device ELD may be parallel to the third directional axis DR3 which is a direction of a normal line to the plane defined by the first directional axis DR1 and the second directional axis DR2. A front surface (e.g., a top surface) and a rear surface (e.g., a bottom surface) of members constituting the electronic device ELD may be defined based on the third directional axis DR3. The front surface (e.g., a top surface) and the rear surface (e.g., a bottom surface) of each of members constituting the electronic device ELD are opposite to each other in the third direction DR3, and a normal direction to the front surface and the rear surface may be substantially parallel to the third direction DR3. The distance between the front surface and the rear surface defined in the third direction DR3 may correspond to the thickness of the member.

In this specification, the term "on the plane" may indicate a state viewed in the third direction DR3. In this specification, the term "on a cross-sectional view" may indicate a state viewed in the first direction DR1 or the second direction DR2. However, the directions indicated by the first to third directions DR1, DR2, and DR3 are relative concepts and may be switched into another direction.

According to an embodiment, the electronic device ELD may display an image IM through an active region AA-ED. In an embodiment, the active region AA-ED may extend in a plane defined by the first direction DR1 and the second direction DR2. The active region AA-ED may further include a curved surface bent from at least one side of a plane defined by the first direction DR1 and the second direction DR2. In an embodiment, the surface on which the image IM is displayed may correspond to the front surface of the electronic device ELD. The image IM may include at least one still image and/or at least one dynamic image. In the embodiment of FIG. 1, the image IM is software application icons and a clock, temperature and calendar window. However embodiments of the present disclosure are not necessarily limited thereto and the image IM may be various different subject matter.

A peripheral region NAA-ED is adjacent to the active region AA-ED. The peripheral region NAA-ED may surround the active region AA-ED (e.g., in the first and/or second directions DR1, DR2). Accordingly, the shape of the active region AA-ED may be substantially defined by the peripheral region NAA-ED. However, embodiments of the present disclosure are not necessarily limited thereto and the peripheral region NAA-ED may be disposed to be adjacent to only one side of the active region AA-ED or may be omitted in some embodiments. The electronic device ELD according to an embodiment of the present disclosure may include various shapes of active regions, and the shape of the active region AA-ED of the electronic device ELD according to an embodiment of the present disclosure is not necessarily limited to the rectangular shape with rounded corners shown in FIG. 1.

In an embodiment, the electronic device ELD is in the shape of a rectangle having a shorter side extending in the first direction DR1 and a longer side extending in the second direction DR2 crossing the first direction DR1, when viewed in a plan view. However, embodiments of the present disclosure are not necessarily limited thereto, and the electronic device ELD may have various shapes, such as a circle shape or another polygon shape, when viewed in a plan view.

The electronic device ELD may sense an external input TC applied from the outside. In an embodiment, the external input TC may include various types of inputs such as a part of a physical body of the user US, light, heat, force, pressure, or the combination thereof. According to an embodiment, the external input TC is a touch input by a hand of a user US applied to the front surface of the electronic device ELD. However, embodiments of the present disclosure are not necessarily limited thereto and the external input TC may include all inputs of the input sensor to provide a change in capacitance. A region of the electronic device ELD to sense the external input TC is not necessarily limited to the front surface of the electronic device ELD. For example, in some embodiments the electronic device ELD may sense the external input TC of the user US, which is applied to the side surface or the rear surface, depending on the structure of the electronic device ELD.

Referring to FIGS. 1 to 3, according to an embodiment, the electronic device ELD includes a display module DM. The display module DM may be a component to generate an image IM and to sense an external input TC applied from the outside. According to an embodiment, the display module DM may include a display panel DP and an input sensor ISP disposed on the display panel DP. In addition, according to an embodiment, the display module DM may further include an optical layer AF disposed on the input sensor ISP.

According to an embodiment, the electronic device ELD may include a window module WM disposed on the display module DM. In addition, in an embodiment the electronic device ELD may further include an electronic module EM, a power supply module PSM, and a housing EDC.

According to an embodiment, the display module DM may be defined with an active region AA and a peripheral region NAA. The active region AA may be activated in response to an electrical signal. The peripheral region NAA may be a region positioned adjacent to at least one side of the active region AA (e.g., in the first and/or second directions DR1, DR2).

The active region AA may correspond to the active region AA-ED of the electronic device ELD illustrated in FIG. 1. The peripheral region NAA may be disposed to surround the active region AA (e.g., in the first and/or second directions DR1, DR2). However, embodiments of the present disclosure are not necessarily limited thereto. According to an embodiment, a portion of the peripheral region NAA may be omitted, which is different from that as illustrated in FIG. 2. The peripheral region NAA may correspond to the peripheral region NAA-ED of the electronic device ELD illustrated in FIG. 1.

According to an embodiment, the display module DM may include the peripheral region NAA disposed on at least one side of the active region AA. The region of the peripheral region NAA in which pads (see D-PD in FIG. 5; T-PD in FIG. 6) are disposed may be referred to as a pad region. The pad region may be a portion of the peripheral region NAA. In an embodiment, a driving circuit or driving line to drive the active region AA may be further disposed in the peripheral region NAA.

The window module WM may be disposed on the display module DM (e.g., disposed directly thereon in the third direction DR3) to protect the display module DM from an external impact or a scratch. The window module WM may cover an entire outer portion of the display module DM. The front surface of the window module WM may correspond to the top surface of the electronic device ELD.

According to an embodiment, the window module WM may include a base member WP which is composed of an optically transparent insulating material. In an embodiment, the base member WP may include an insulating material which is optically transparent. For example, the base member WP may include at least one of a glass member and a synthetic resin film. The base member WP may have a single-layer structure or a multi-layer structure formed by combining a plurality of films with each other. In an embodiment, the window module WM may further include a functional layer (not shown) such as an anti-fingerprint layer, a phase control layer, or a hard coating layer disposed on the base member WP.

The window module WM may further include an adhesive layer AP disposed between the base member WP and the display module DM (e.g., in the third direction DR3). The base member WP and the display module DM may be combined with each other through the adhesive layer AP. However, embodiments the present disclosure are not necessarily limited thereto. For example, in some embodiments the adhesive layer AP may be omitted. In an embodiment, the window module WM may be disposed directly on the display module DM.

The window module WM may be divided into a transmission part TA and a bezel part BZA. The transmission part TA may be a part corresponding to the active region AA of the display module DM, and the bezel part BZA may be a part corresponding to the peripheral region NAA of the display module DM. The bezel part BZA may define the shape of the transmission part TA. The bezel part BZA may be adjacent to the transmission part TA while surrounding the transmission part TA (e.g., in the first and/or second directions DR1, DR2). However, embodiments of the present disclosure are not necessarily limited thereto. For example, in some embodiments the bezel part BZA may be disposed to be adjacent to only one side of the transmission part TA, and a portion of the bezel part BZA may be omitted.

In an embodiment, the window module WM may further include a bezel pattern BZP disposed to correspond to the bezel part BZA. For example, the bezel pattern BZP may be a color layer formed on one surface of the base member WP. The bezel pattern BZP may include a material having a color. For example, the bezel pattern BZP may include an organic material having a color. The bezel pattern BZP may have a single layer structure or a multi-layer structure. The bezel part BZA of the window module WM in which the bezel pattern BZP is disposed may have a light transmittance rate lower than that of the transmission part TA.

In an embodiment, the display module DM may further include a main circuit board MCB, a flexible circuit film FCB, a data driver DIC (see FIG. 5), a sensor control circuit T-IC, and a main controller MC.

The main circuit board MCB may be electrically connected to the display module DM through the flexible circuit film FCB. The main circuit board MCB may be electrically connected to the electronic module EM through a connector (not shown).

The flexible circuit film FCB may be connected to the display panel DP and the input sensor ISP, such that the display panel DP and the input sensor ISP are electrically connected to the main circuit board MCB. In an embodiment, the input sensor ISP may be electrically connected to the display panel DP and may be electrically connected to the main circuit board MCB through the flexible circuit film FCB. However, embodiments of the present disclosure are not necessarily limited thereto. For example, in an embodiment the input sensor ISP may be electrically connected to the main circuit board MCB through an additional flexible circuit film, or the main circuit board MCB may be directly connected to the display panel DP without the flexible circuit film FCB.

In an embodiment, at least one of the data driver DIC (see FIG. 5), the sensor control circuit T-IC, and the main controller MC may be provided in the form of integrated chips. The data driver DIC (see FIG. 5) may be mounted on the display module DM, and the sensor control circuit T-IC and the main controller MC may be mounted on the main circuit board MCB. However, embodiments of the present disclosure are not necessarily limited thereto. For example, in an embodiment the data driver DIC (see FIG. 5) may be mounted on the flexible circuit film FCB.

The main controller MC may control the overall operation of the electronic device ELD. For example, the main controller MC may control the operations of the display panel DP and the input sensor ISP. In addition, the main controller MC may control the operation of the electronic module EM. The main controller MC may include at least one microprocessor.

The data driver DIC (see FIG. 5) may include a driving circuit to drive pixels PX (see FIG. 5) of the display panel DP. The data driver DIC (see FIG. 5) may receive image data and a control signal from the main controller MC. For example, in an embodiment the control signal may include an input vertical synchronization signal, an input horizontal synchronization signal, a main clock signal, and a data enable signal.

The sensor control circuit T-IC may apply an electrical signal for driving the input sensor ISP to the input sensor ISP. The sensor control circuit T-IC may receive a control signal such as a clock signal from the main controller MC.

The electronic module EM may include various functional modules necessary for driving the electronic device ELD. For example, in an embodiment the electronic module EM may include a wireless communication module, an image input module, a sound input module, a sound output module, a memory, or an external interface module. The modules of the electronic module EM may be mounted on the main circuit board MCB or electrically connected to the main circuit board MCB through a separate flexible circuit board.

The power supply module PSM may be electrically connected to the electronic module EM. The power supply module PSM may supply power necessary for the overall operation of the electronic device ELD. For example, the power supply module PSM may include a typical battery device.

The window module WM and the housing EDC may be coupled to each other to form an outer appearance of the electronic device ELD. The window module WM and the housing EDC are combined with each other to form an inner space to receive and house components of the electronic device ELD. For example, the display module DM, the flexible circuit film FCB, the main circuit board MCB, the electronic module EM, and the power supply module PSM may be received in the inner space. In an embodiment, a portion of the display module DM may be bent such that the flexible circuit film FCB and the main circuit board MCB are disposed under the rear surface of the display module DM and may be received in the housing EDC.

The housing EDC may include a material having a relatively strong rigidity. For example, in some embodiments the housing EDC may include glass, plastic, or metal or may include a frame and/or plate including the combination thereof. The housing EDC may absorb an impact applied from the outside (e.g., the external environment) or prevent moisture or foreign substance such as other contaminants from being infiltrated from the outside to protect the display module DM received in the housing EDC.

According to an embodiment, the display panel DP in the electronic device ELD may be a component to generate an image IM. In an embodiment, the display panel DP may be an emissive-type display panel. For example, in some embodiments the display panel DP may be an organic light emitting display panel, an inorganic light emitting display panel, a quantum dot display panel, a micro-LED display panel, or a nano-LED display panel. The display panel DP may be referred to as a display layer.

Referring to FIG. 3, in an embodiment the display panel DP may include a base layer BS, a circuit layer DP-CL, a display element layer DP-ED, and an encapsulation layer TFE.

The base layer BS may be a member to provide a base surface for disposing the circuit layer DP-CL. In an embodiment, the base layer BS may be a rigid substrate, or a flexible substrate allowing bending, folding, or rolling. For example, the base layer BS may be a glass substrate, a metal substrate, or a polymer substrate. However, embodiments of the present disclosure are not necessarily not limited thereto, and the base layer BS may be an inorganic layer, an organic layer, or a composite material layer in some embodiments.

The base layer BS may have a multi-layer structure. For example, in an embodiment the base layer BS may include a first synthetic resin layer, an intermediate layer having a multi-layer structure or a single-layer structure, and a second synthetic resin layer disposed on the intermediate layer. The intermediate layer may be referred to a base barrier layer. In an embodiment, the intermediate layer may include a silicon oxide ($SiO_x$) layer and an amorphous silicon (a-Si) layer disposed on the silicon oxide layer (e.g., disposed directly thereon in the third direction DR3). However, embodiments of the present disclosure are not necessarily limited thereto. For example, in an embodiment the intermediate layer may include at least one of a silicon oxide layer, a silicon nitride layer, a silicon oxynitride layer, and an amorphous silicon layer.

In an embodiment, each of the first and second synthetic resin layers may include polyimide-based resin. Also, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In the present specification, the wording "~-based resin" may refer to that "~-based resin" includes a functional group of "~"

The circuit layer DP-CL may be disposed on the base layer BS (e.g., disposed directly thereon in the third direction DR3). In an embodiment, the circuit layer DP-CL may include an insulating layer, a semiconductor pattern, a conductive pattern, and a signal line. In an embodiment, the insulating layer, the semiconductor layer, and the conductive layer are formed on the base layer BS through a coating process or a deposition process. The insulating layer, the semiconductor layer, and the conductive layer may be selectively patterned through a plurality of photolithography processes. In such a manner, the semiconductor pattern, the conductive pattern, and the signal line included in the circuit layer DP-CL may be formed. Insulating layers included in the circuit layer DP-CL may include a plurality of inorganic insulating layers and a plurality of organic insulating layers.

The display element layer DP-ED may be disposed on the circuit layer DP-CL (e.g., disposed directly thereon in the third direction DR3). The display element layer DP-ED may include a light emitting element. For example, in an embodiment the display element layer DP-ED may include an organic light emitting material, an inorganic light emitting material, an organic-inorganic light emitting material, a quantum dot, a quantum rod, a micro-LED, or a nano-LED. However, embodiments of the present disclosure are not necessarily limited thereto. The light emitting elements of the display element layer DP-ED may be electrically connected to the driving elements of the circuit layer DP-CL to generate light and display an image IM in response to a signal provided by the driving elements.

The encapsulation layer TFE may be disposed on the display element layer DP-ED (e.g., disposed directly thereon in the third direction DR3). The encapsulation layer TFE may protect the display element layer DP-ED from moisture, oxygen, and foreign substance such as dust particles. The encapsulation layer TFE may encapsulate light emitting elements of the display element layer DP-ED. The encapsulation layer TFE may include at least one thin film to increase the optical efficiency of the display element layer DP-ED, or protect the display element layer DP-ED.

In an embodiment, the input sensor ISP may be disposed directly on the display panel DP (e.g., in the third direction DR3). For example, the input sensor ISP may be disposed directly on an upper surface of the encapsulation layer TFE. The input sensor ISP may sense the external input TC applied from the outside. The external input TC may be the input of the user US. In an embodiment, the input of the user US may include any one of various external inputs, such as a part of a physical body of the user US, light, heat, force, pressure, or the combination thereof. The input of the user US may be an input that approaches the input sensor ISP or directly contacts the input sensor ISP. The input sensor ISP may sense the external input TC to apply an input signal including information on the external input TC, such that the display panel DP generates the image IM corresponding to the external input TC. In an embodiment, the input sensor ISP may be driven in various ways such as a capacitive scheme, a resistive scheme, an infrared scheme, a sound wave scheme, or a pressure scheme. However, embodiments of the present disclosure are not necessarily limited to any one of the schemes. The following description will be made regarding that the input sensor ISP is driven through a capacitive scheme for convenience of explanation.

The input sensor ISP may be directly disposed on the display panel DP through a subsequent process. In this embodiment, the input sensor ISP may be expressed as being directly disposed on the display panel DP. "The input sensor ISP may be directly disposed on the display panel DP" may refer to that a third component is not interposed between the input sensor ISP and the display panel DP. For example, an additional adhesive member may not be interposed between the input sensor ISP and the display panel DP (e.g., in the third direction DR3).

The optical layer AF may be disposed on the input sensor ISP (e.g., disposed directly thereon). In an embodiment, the optical layer AF may be a reflection reducing layer to minimize the reflectance from the external light incident from the outside of the display module DM. In an embodiment, the optical layer AF may be formed on the input sensor ISP through the subsequent process. For example, in an embodiment the optical layer AF may include a polarizing film including a phase retarder and/or a polarizer, multiple reflection layers to cancel the reflecting lights, or color filters arranged to correspond to a pixel arrangement of the display panel DP and a color of emitted light. For example, in an embodiment in which the optical layer AF includes color filters, the color filter may be arranged based on the color of the light emitted from pixels included in the display panel DP. However, embodiments of the present disclosure are not necessarily limited thereto. For example, in an embodiment the optical layer AF may be omitted.

Figure 4:
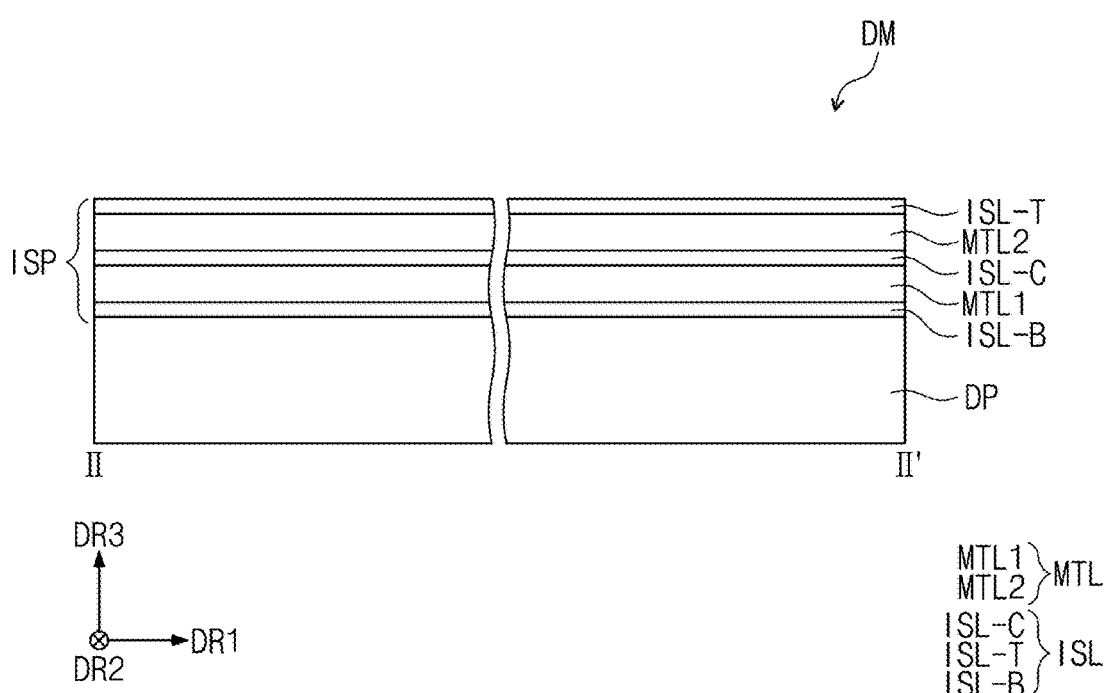
FIG. 4 is a cross-sectional view of a display module according to an embodiment of the present disclosure.

FIG. 4 is a cross-sectional view of a portion of a display module according to an embodiment. FIG. 4 is a cross-sectional view of the display module DM taken along line II-II' of FIG. 2. FIG. 4 may be a cross-sectional view corresponding to a portion of the active region AA (see FIG. 2) of the display module DM.

According to an embodiment, the display module DM may include the display panel DP and the input sensor ISP. The input sensor ISP may be referred to as a sensor layer, an input sensing layer, or an input sensing panel. The description about the display panel DP made with reference to FIGS. 2 and 3 will be identically applied to the following description on the display panel DP.

Referring to FIG. 4, in an embodiment the input sensor ISP may be disposed directly on the display panel DP (e.g., in the third direction DR3). The input sensor ISP may be disposed directly on a top surface of the display panel DP. In an embodiment, the input sensor ISP may include a plurality of sensor insulating layers ISL and a plurality of sensor conductive layers MTL. The first sensor insulating layers ISL-B of the plurality of sensor insulating layers ISL may be directly disposed on the display panel DP. For example, in an embodiment as shown in FIG. 4, the input sensor ISP may include a first sensor insulating layer ISL-B, a first sensor conductive layer MTL1, a second sensor insulating layer ISL-C, a second sensor conductive layer MTL2, and a third sensor insulating layer ISL-T sequentially stacked on the display panel DP in the third direction DR3.

The first sensor insulating layer ISL-B may be in direct contact with a top surface of the display panel DP. The first sensor insulating layer ISL-B may include a base insulating layer. In addition, the first sensor insulating layer ISL-B may include a buffer insulating layer. For example, the first sensor insulating layer ISL-B may be a single layer including only a base insulating layer or a buffer insulating layer or a stack structure including a buffer insulating layer and a base insulating layer. However, embodiments of the present disclosure are not necessarily limited thereto.

In an embodiment, each of the first sensor conductive layer MTL1 and the second sensor conductive layer MTL2 may be a multi-layer structure. The sensor conductive layer in the multi-layer structure may have a structure in which a transparent conductive layer and/or a metal layer are stacked in at least two layers (e.g., in the third direction DR3). For example, the sensor conductive layer in the multi-layer structure may have a stack structure in which the transparent conductive layer and the metal layer are stacked (e.g., in the third direction DR3), or in which metal layers including mutually different metals are stacked (e.g., in the third direction DR3).

For example, in an embodiment a transparent conductive layer included in the first sensor conductive layer MTL1 and the second sensor conductive layer MTL2 may include indium tin oxide (ITO), indium zinc oxide (IZO), zinc oxide (ZnO), indium tin zinc oxide (ITZO), PEDOT, a metal nano-wire, or graphene. The metal layer included in the first sensor conductive layer MTL1 and the second sensor conductive layer MTL2 may include molybdenum (Mo), silver (Ag), titanium (Ti), copper (Cu), aluminum (Al), or an alloy thereof. However, embodiments of the present disclosure are not necessarily limited thereto.

The first sensor conductive layer MTL1 and the second sensor conductive layer MTL2 may include sensing electrodes TE (see FIG. 6) of the input sensor ISP to be described below and may further include sensing lines TL (see FIG. 6).

In an embodiment, the second sensor insulating layer ISL-C may be disposed on the first sensor conductive layer MTL1 (e.g., disposed directly thereon in the third direction DR3). In an embodiment, the third sensor insulating layer ISL-T may be disposed on the second sensor conductive layer MTL2 (e.g., disposed directly thereon in the third direction DR3). Each of the second sensor insulating layer ISL-C and the third sensor insulating layer ISL-T may include an inorganic layer. In addition, each of the second sensor insulating layer ISL-C and the third sensor insulating layer ISL-T may include an organic layer.

In an embodiment, each of the first sensor insulating layer ISL-B, the second sensor insulating layer ISL-C, and the third sensor insulating layer ISL-T may include at least one of silicon nitride ($SiN_x$) and silicon oxynitride ($SiO_xN_y$). In addition, the first sensor insulating layer ISL-B, the second sensor insulating layer ISL-C, and the third sensor insulating layer ISL-T may include silicon oxide ($SiO_x$). The first sensor insulating layer ISL-B, the second sensor insulating layer ISL-C, and the third sensor insulating layer ISL-T may include at least one of aluminum oxide, titanium oxide, zirconium oxide, and hafnium oxide as inorganic layers. The 'x' and 'y' may be greater than '0' respectively in the expressions of silicon nitride ($SiN_x$), silicon oxynitride ($SiO_xN_y$) and silicon oxide ($SiO_x$).

In an embodiment in which the first sensor insulating layer ISL-B, the second sensor insulating layer ISL-C, and the third sensor insulating layer ISL-T include an organic layer, the organic layer may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, and perylene-based resin.

Although FIG. 4 illustrates that the input sensor ISP includes the first sensor conductive layer MTL1 and the second sensor conductive layer MTL2 stacked sequentially. Embodiments of the present disclosure are not necessarily limited thereto. For example, in an embodiment, the input sensor ISP may include only one sensor conductive layer MTL disposed on the first sensor insulating layer ISL-B. In this embodiment, one of the second sensor insulating layer ISL-C and the third sensor insulating layer ISL-T may be omitted.

Although FIG. 4 illustrates that each of the first sensor conductive layer MTL1 and the second sensor conductive layer MTL2 has the form of one layer overlapped with the entire portion of the display panel DP to schematically express a stack structure, embodiments of the present disclosure are not necessarily limited thereto. For example, in an embodiment each of the first sensor conductive layer MTL1 and the second sensor conductive layer MTL2 may be patterned.

Figure 5:
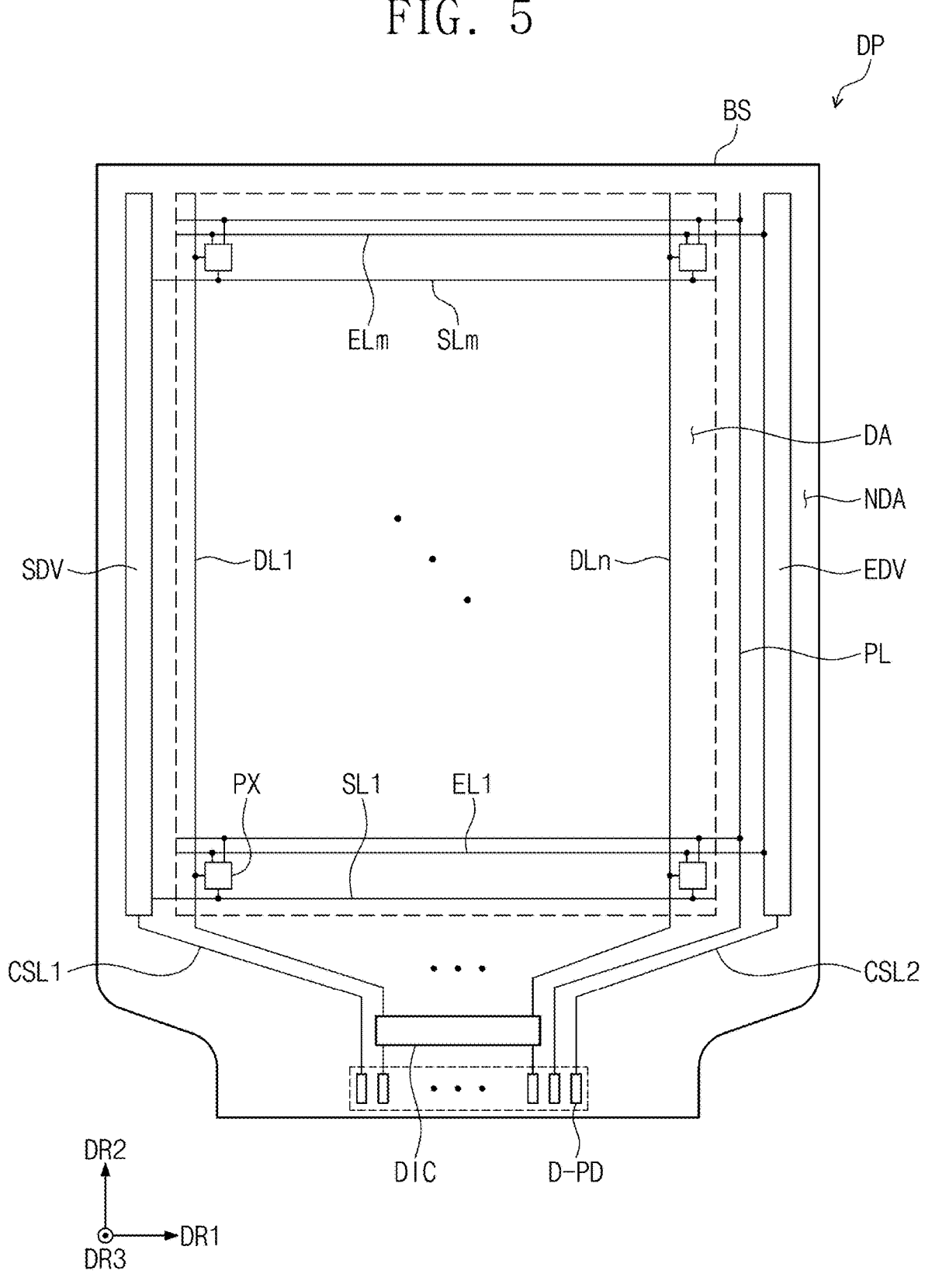
FIG. 5 is a plan view illustrating a display panel according to an embodiment of the present disclosure.

FIG. 5 is a plan view of a display panel according to an embodiment.

Referring to FIG. 5, the display panel DP may include the base layer BS, pixels PX, signal lines SL1-SLm, DL1-DLn, EL1-ELm, CSL1, CSL2, and PL that are electrically connected to the pixels PX, a scan driver SDV, the data driver DIC, an emission driver EDV, and panel pads D-PD.

The base layer BS may provide a base surface for disposing elements and lines of the display panel DP. The base layer BS may include a display region DA and a non-display region NDA. The display region DA includes the pixels PX arranged therein to display an image. The non-display region NDA may be adjacent to the display region DA (e.g., in the first and/or second directions DR1, DR2), may be provided to dispose elements and lines to drive the pixels PX, and may be a region in which the image is not displayed. The display region DA may correspond to the active region AA (see FIG. 2) of the display module DM, and the non-display region NDA may correspond to the peripheral region NAA (see FIG. 2) of the display module DM.

In an embodiment, each of the pixels PX may include a pixel driving circuit including transistors (e.g., a switching transistor, or a driving transistor) and a capacitor, and a light emitting element electrically connected to the pixel driving circuit. The pixels PX may emit light corresponding to an electrical signal applied to the pixels PX.

In an embodiment as shown in FIG. 5, the scan driver SDV, the data driver DIC, and the emission driver EDV may be disposed in the non-display region NDA. However, embodiments of the present disclosure are not necessarily limited thereto. For example, at least one of the scan driver SDV, the data driver DIC, and the emission driver EDV may be disposed in the display region DA. Accordingly, the area of the non-display region NDA may be reduced.

The signal lines SL1-SLm, EL1-ELm, DL1-DLn, CSL1, CSL2, and PL may include the scan lines SL1-SLm, the data lines DL1-DLn, the emission lines EL1-ELm, the first and second control lines CSL1 and CLS2, and the power line PL. In an embodiment, "m" and "n" are natural numbers greater than or equal to 1. The pixels PX may be electrically connected to relevant scan lines, relevant data lines, and relevant emission lines of the scan lines SL1-SLm, the data lines DL1-DLn, and the emission lines EL1-ELm. However, embodiments of the present disclosure are not necessarily limited thereto and many other types of signal lines may be provided in the display panel DP depending on the configuration of the pixel driving circuit of the pixels PX.

In an embodiment, the scan lines SL1-SLm may be electrically connected to the scan driver SDV while extending in the first direction DR1. The data lines DL1-DLn may be electrically connected to the data driver DIC while extending in the second direction DR2. The emission lines EL1-ELm may extend in the first direction DR1 to be connected to the emission driver EDV.

In an embodiment, the power line PL may include a portion extending in the first direction DR1 and a portion extending in the second direction DR2. The portion that extends in the first direction DR1 of the power line PL may be disposed in the non-display region NDA. The portion that extends in the first direction DR1 of the power line PL may be electrically connected to the pixels PX and the portion that extends in the second direction DR2 of the power line PL. In an embodiment, a portion that extends in the second direction DR2 of the power line PL may be disposed in a layer that is different from a layer for a portion that extends in the first direction DR1 of the power line PL and may be connected to the portion that extends in the first direction DR1 of the power line PL through a contact hole. Alternatively, the portion that extends in the second direction DR2 of the power line PL may be integrally formed in the same layer as a portion that extends in the first direction DR1 of the power line PL.

The first control line CSL1 may be electrically connected to the scan driver SDV. The second control line CSL2 may be electrically connected to the emission driver EDV.

In an embodiment, the panel pads D-PD may be disposed adjacent to a lower end of the non-display region NDA (e.g., in the second direction DR2). The panel pads D-PD may be closer to a lower end of the display panel DP than the data driver DIC. The panel pads D-PD may be spaced apart from each other in the first direction DR1. The panel pads D-PD may be parts to which a circuit board for providing a signal for controlling the operations of the scan driver SDV, the data driver DIC, and the emission driver EDV of the display panel DP is electrically connected.

The panel pads D-PD may be defined as display pads electrically connected to the pixels PX. The panel pads D-PD may be connected to (e.g., electrically connected to) relevant signal lines of the signal lines SL1-SLm, EL1-ELm, DL1-DLn, CSL1, CSL2, and PL. For example, the power line PL, the first and second control lines CSL1 and CSL2 and the data lines DL1-DLn may be connected to relevant panel pads D-PD, respectively. The data lines DL1-DLn may be connected to the relevant panel pad D-PD through the data driver DIC.

In an embodiment, the scan driver SDV may generate scan signals in response to a scan control signal. The scan signals may be applied to the pixels PX through the scan lines SL1-SLm. The data driver DIC may generate a plurality of data voltages corresponding to image signals in response to the data control signal. The data voltages may be applied to the pixels PX through the data lines DL1-DLn. The emission driver EDV may generate a plurality of light emitting signals, in response to the light emitting control signal. The light emitting signals may be applied to the pixels PX through the emission lines EL1-ELm.

The pixels PX may receive data voltages in response to the scan signals. The pixels PX may display the image, as the pixels PX emit light having brightness corresponding to data voltages, in response to the light emitting signals. The time to emit light by the pixels PX may be controlled through the light emitting signals. Accordingly, the display panel DP may generate an image onto the display region DA through the pixels PX.

Figure 6:
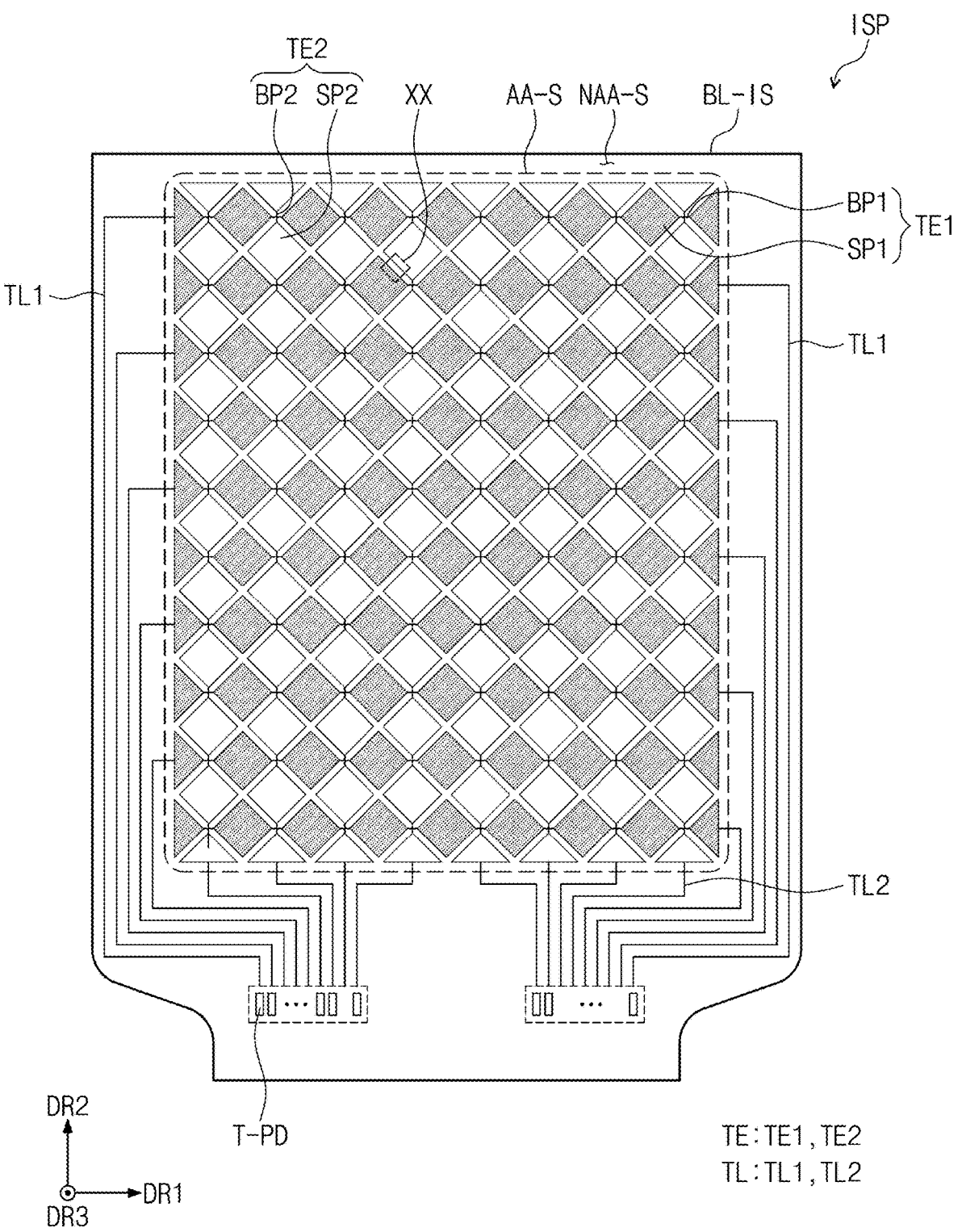
FIG. 6 is a plan view illustrating an input sensor according to an embodiment of the present disclosure.

FIG. 6 is a plan view of an input sensor, according to an embodiment of the present disclosure.

Referring to FIG. 6, the input sensor ISP may include a sensing region AA-S and a non-sensing region NAA-S adjacent to the sensing region AA-S. The sensing region AA-S may correspond to the active region AA (see FIG. 2) of the display module DM. The sensing region AA-S may be a region for disposing the sensing electrodes TE of the input sensor ISP to sense the external input TC (see FIG. 1). The non-sensing region NAA-S may correspond to the peripheral region NAA (see FIG. 2) of the display module DM. The non-sensing region NAA-S may be a region for disposing an element or lines for driving the sensing electrodes TE disposed in the sensing region AA-S.

In an embodiment, the input sensor ISP may include the sensing electrodes TE, the sensing lines TL, and sensing pads T-PD disposed on the first sensor insulating layer ISL-B.

The sensing electrodes TE may include first sensing electrodes TE1 and second sensing electrodes TE2 electrically insulated from each other while crossing each other, when viewed in a plan view. In an embodiment, the input sensor ISP may acquire information about an external input TC through the variation in mutual capacitance between the first sensing electrodes TE1 and the second sensing electrodes TE2.

In an embodiment, the first sensing electrodes TE1 may extend in the first direction DR1, and may be arranged in the second direction DR2. The first sensing electrodes TE1 may be provided in multiple rows arranged in the second direction DR2. Although FIG. 6 illustrates 10 first sensing electrodes TE1 arranged in the second direction DR2, embodiments of the present disclosure are not necessarily limited thereto and the number of the first sensing electrodes TE1 included in the input sensor ISP may vary.

In an embodiment, the second sensing electrodes TE2 may extend in the second direction DR2, and may be arranged in the first direction DR1. The second sensing electrodes TE2 may be provided in multiple columns arranged in the first direction DR1. Although FIG. 6 illustrates 8 second sensing electrodes TE2 arranged in the first direction DR1, embodiments of the present disclosure are not necessarily limited thereto and the number of the second sensing electrodes TE2 included in the input sensor ISP may vary.

Each of the first sensing electrodes TE1 may include first sensor patterns SP1 and first connection patterns BP1. The first sensor patterns SP1 may be arranged in the first direction DR1. The first connection patterns BP1 may connect (e.g., electrically connect) the first sensor patterns SP1, which are adjacent to each other in the first direction DR1, to each other. In an embodiment, the first connection patterns BP1 may be disposed in the same layer as that of the first sensor patterns SP1, and may have the form integrated with the first sensor patterns SP1 while extending from the first sensor patterns SP1 when viewed in a plan view. For example, the first sensor patterns SP1 and the first connection patterns BP1 may be patterns patterned and formed from the same conductive layer through the same process. However, embodiments of the present disclosure are not necessarily limited thereto as long as the first connection patterns BP1 electrically connect the first sensor patterns SP1, which are adjacent to each other in the first direction DR1, to each other Each of the second sensing electrodes TE2 may include second sensor patterns SP2 and second connection patterns BP2. The second sensor patterns SP2 may be arranged in the second direction DR2. The second connection patterns BP2 may connect (e.g., electrically connect) the second sensor patterns SP2, which are adjacent to each other in the second direction DR2, to each other. Alternatively, the second connection patterns BP2 may be formed in a layer different from a layer of the second sensor patterns SP2 and may be connected to the relevant second sensor patterns SP2 through a contact hole. The second sensor patterns SP2 spaced apart from each other in the second direction DR2 may be electrically connected to the second connection patterns BP2. The second connection patterns BP2 may be defined as bridge patterns disposed at a layer different from a layer of the second sensor patterns SP2 to electrically connect the second sensor patterns SP2 to each other.

According to an embodiment, the first sensor patterns SP1, the first connection patterns BP1, and the second sensor patterns SP2 may be disposed in the same layer as each other. The second connection patterns BP2 may be disposed in a layer different from a layer of the second sensor patterns SP2. For example, the first sensor patterns SP1, the first connection patterns BP1, and the second sensor patterns SP2 may be included in the second sensor conductive layer MTL2 (see FIG. 4), and the second connection patterns BP2 may be included in the first sensor conductive layer MTL1 (see FIG. 4). However, embodiments of the present disclosure are not necessarily limited thereto. For example, in an embodiment the first sensor patterns SP1, the first connection patterns BP1, and the second sensor patterns SP2 may be included in the first sensor conductive layer MTL1 (see FIG. 4), and the second connection patterns BP2 may be included in the second sensor conductive layer MTL2 (see FIG. 4). Alternatively, in an embodiment, the first sensor patterns SP1, the second sensor patterns SP2, and the second connection patterns BP2 may be disposed in the same layer as each other, and the first connection patterns BP1 may be disposed in a layer different from a layer of the first sensor patterns SP1. Alternatively, in an embodiment, the first sensor patterns SP1 and the first connection patterns BP1 may be disposed in the same layer as each other, and the second sensor patterns SP2 and the second connection patterns BP2 may be disposed in the same layer as each other and a different layer from a layer of the first sensor patterns SP1 and the first connection patterns BP1.

In an embodiment, the sensing lines TL may include first sensing lines TL1 and second sensing lines TL2. The first sensing lines TL1 may be connected to (e.g., electrically connected thereto) the first sensing electrodes TE1, respectively. The first sensing lines TL1 may be connected to (e.g., directly connected thereto) first sensing electrodes TE1 that is provided in a relevant row, among the first sensing electrodes TE1 provided in the multiple rows. The second sensing lines TL2 may be connected to the second sensing electrodes TE2, respectively. The second sensing lines TL2 may be connected to (e.g., electrically connected thereto) second sensing electrodes TE2, which are provided in a relevant column, among the second sensing electrodes TE2 provided in multiple columns.

The second sensing lines TL2 may be connected to lower portions of the second sensing electrodes TE2 (e.g., in the second direction DR2) which are adjacent to the sensing pads T-PD. The second sensing lines TL2 may extend from a lower portion of the relevant second sensing electrode TE2 and be connected to (e.g., directly connected thereto) the sensing pads T-PD, in the non-sensing region NAA-S.

As illustrated in FIG. 6, the first sensing lines TL1 may be connected to a left portion or a right portion of the first sensing electrodes TE1 (e.g., in the first direction DR1). For example, each of the first sensing lines TL1, which are connected to the first sensing electrodes TE1 in the odd-numbered row, of the first sensing lines TL1 may be connected to a left portion (e.g., in the first direction DR1) of the relevant first sensing electrode TE1 of the first sensing electrodes TE1 provided in the odd-numbered row. For example, each of the first sensing lines TL1, which are connected to the first sensing electrodes TE1 in an even-numbered row, of the first sensing lines TL1 may be connected to a right portion (e.g., in the first direction DR1) of the relevant first sensing electrode TE1 of the first sensing electrodes TE1 provided in the even-numbered row. The first sensing lines TL1 may extend from a right end portion or a left end portion of the relevant first sensing electrode TE1 in the second direction DR2 and be connected to the sensing pads T-PD, in the non-sensing region NAA-S.

The sensing pads T-PD may be disposed in the non-sensing region NAA-S. The sensing pads T-PD may be disposed to be adjacent to a lower portion of a sensor base layer BL-IS. The sensing pads T-PD may be electrically connected to the sensing lines TL. The sensing pads T-PD may be spaced apart from each other (e.g., in the first direction DR1) and electrically connected to the sensing lines TL, respectively. The sensing pads T-PD may be electrically connected to the circuit board providing a driving signal. The sensing pads T-PD may apply a signal to the sensing electrodes TE or receive a signal from the sensing electrodes TE through the sensing lines TL.

According to an embodiment, driving signals for driving the first sensing electrodes TE1 and the second sensing electrodes TE2 may be applied to the first sensing electrodes TE1 and the second sensing electrodes TE2 through the second sensing lines TL2. The signal including information sensed by the first sensing electrodes TE1 and the second sensing electrodes TE2 may be output through the first sensing lines TL1. However, embodiments of the present disclosure are not necessarily limited thereto.

In an embodiment, the sensing pads T-PD may be formed integrally with the sensing lines TL corresponding to the sensing pads T-PD. In an embodiment, the sensing pads T-PD may not be separated from the sensing lines TL, and one end portion of the sensing lines TL may correspond to a sensing pad part connected to a driving chip in the circuit board.

The sensing pads T-PD and the sensing lines TL may be formed based on the sensor conductive layer MTL (see FIG. 4) of the input sensor ISP. For example, in an embodiment the sensing pads T-PD and the sensing lines TL may be formed through the same process as that of the first sensor conductive layer MTL1. However, embodiments of the present disclosure are not necessarily limited thereto. For example, depending on the deposition of the sensing electrodes TE, the sensing pads T-PD and the sensing lines TL may be formed through the same process as that of the second sensor conductive layer MTL2, or some of the sensing pads T-PD and the sensing lines TL may be formed through the same process as that of the first sensor conductive layer MTL1 and others of the sensing pads T-PD and the sensing lines TL may be formed through the same process as that of the second sensor conductive layer MTL2.

Figure 7A:
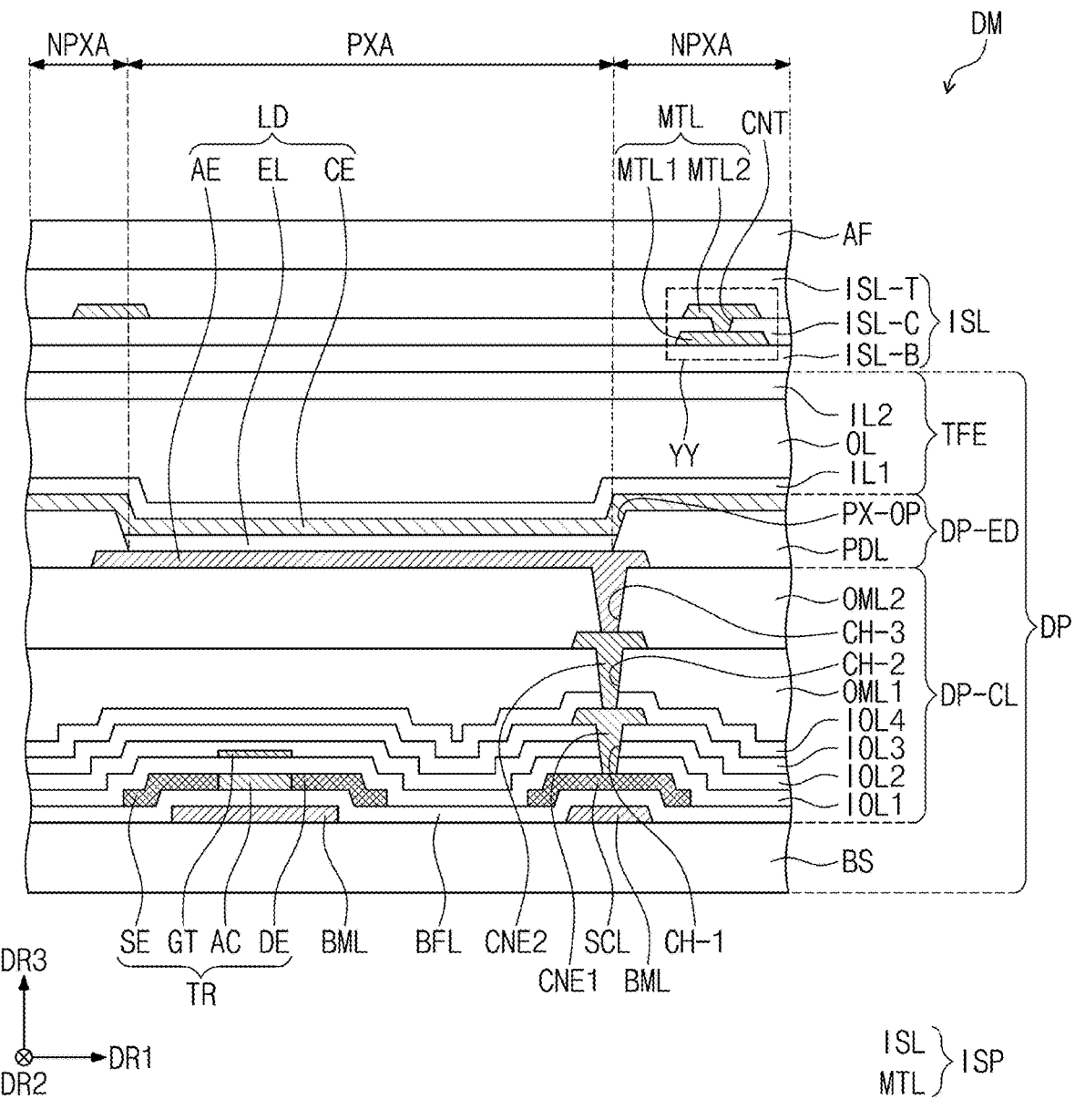
FIG. 7A is a cross-sectional view illustrating a portion of a display module according to an embodiment of the present disclosure.

FIG. 7A is a cross-sectional view of a portion of a display module according to an embodiment of the present disclosure.

FIG. 7A is a cross-sectional view of the display module DM in a portion including any one pixel PX (see FIG. 5) illustrated in FIG. 5. The display module DM includes the display panel DP and the input sensor ISP (see FIG. 4), and the display panel DP includes the base layer BS, the circuit layer DP-CL, the display element layer DP-ED, and the encapsulation layer TFE. Any one pixel PX (see FIG. 5) may have an equivalent circuit including a plurality of transistors, one capacitor, and a light emitting element, and the equivalent circuit of the pixel PX (see FIG. 5) may be modified in various forms. One transistor TR and one light emitting element LD included in the pixel PX (see FIG. 5) are illustrated in FIG. 7A by way of example.

According to an embodiment, the circuit layer DP-CL may include a plurality of insulating layers, a transistor, a conductive pattern, and a signal line.

In an embodiment, a plurality of inorganic layers, a plurality of organic layers, a semiconductor layer, and a conductive layer may be formed through a coating process and a depositing process. Thereafter, the inorganic layers, the organic layers, the semiconductor layer, and the conductive layer may be selectively patterned through a photolithography process. In such a manner, the circuit layer DP-CL including the plurality of insulating layers formed from the inorganic layers and the organic layers, the transistor including the semiconductor pattern formed from the semiconductor layer, and a conductive pattern and the signal line formed from the conductive layer may be formed.

Thereafter, the display element layer DP-ED including the light emitting element LD including the conductive pattern may be formed on (e.g., disposed directly thereon in the third direction DR3) the circuit layer DP-CL, and the encapsulation layer TFE may be formed to cover the display element layer DP-ED.

Referring to FIG. 7A, in an embodiment the circuit layer DP-CL may include a shielding electrode BML, a buffer layer BFL, a plurality of insulating layers IOL1, IOL2, IOL3, and IOL4 including an inorganic layer, a plurality of insulating layers OML1 and OML2 including an organic layer, the transistor TR, connection electrodes CNE1 and CNE2, and a signal line SCL.

The shielding electrode BML may be disposed on the base layer BS (e.g., disposed directly thereon in the third direction DR3). The shielding electrode BML may be overlapped (e.g., in the third direction DR3) with the transistor TR. In addition, in an embodiment, the shielding electrode BML may be disposed under the signal line SCL (e.g., in the third direction DR3). The shielding electrode BML may protect a semiconductor pattern or a conductive pattern, such as the transistor TR and the signal line SCL by blocking light incident on the transistor TR or the signal line SCL from the lower portion of the display panel DP. The shielding electrode BML may include a conductive material. According to an embodiment, the shielding electrode BML may be connected to (e.g., electrically connected thereto) the power line PL (see FIG. 5) to receive a voltage. In an embodiment, when a voltage is applied to the shielding electrode BML, a threshold voltage of the transistor TR disposed on the shielding electrode BML may be maintained. However, embodiments of the present disclosure are not necessarily limited thereto, and the shielding electrode BML may be a floating electrode (e.g., an electrically isolated electrode) in some embodiments. According to an embodiment, the shielding electrode BML may be omitted.

The buffer layer BFL may be disposed on (e.g., disposed directly thereon in the third direction DR3) the base layer BS to cover the shielding electrode BML. The buffer layer BFL may increase a coupling force between a semiconductor pattern or a conductive pattern, which is disposed on the buffer layer BFL, and the base layer BS. In addition, the buffer layer BFL may prevent the diffusion of metal atoms or impurities from the base layer BS into the semiconductor pattern or the conductive pattern.

In an embodiment, the buffer layer BFL may be an inorganic layer. For example, the buffer layer BFL may include at least one of silicon oxide, silicon nitride, and silicon oxynitride. For example, in an embodiment the buffer layer BFL may include a structure in which a silicon oxide layer and a silicon nitride layer are alternately stacked (e.g., in the third direction DR3).

In an embodiment, the transistor TR may include a source SE, a channel AC, a drain DE, and a gate GT. The source SE, the channel AC, and the drain DE of the transistor TR may be formed from a semiconductor pattern. The source SE and the drain DE may extend in opposite directions (e.g., in the first direction DR1 and an opposite direction to the first direction DR1) from the channel AC, when viewed in a cross-sectional view. In addition, FIG. 7A illustrates a portion of the signal line SCL formed from the semiconductor pattern. In an embodiment, the signal line SCL may be connected to the drain DE of the transistor TR, when viewed in a plan view.

In an embodiment, the semiconductor pattern of the transistor TR may include polysilicon, amorphous silicon, or metal oxide. However, embodiments of the present disclosure are not necessarily limited to any one material as long as the material has a semiconductor property.

The semiconductor pattern may include a plurality of regions divided depending on the strength of the conductivity. Among semiconductor patterns, a region doped with dopants or a region in which a metal oxide is reduced shows greater conductivity. The region may serve as a source and a drain of a transistor. The region showing a greater conductivity in the semiconductor pattern may correspond to the source SE and the drain DE of the transistor TR. A region which is not doped or doped at a lightly concentration or a region that shows a lower conductivity as the metal oxide is not reduced, may correspond to the channel AC (e.g., an active) of the transistor TR.

The first insulating layer IOL1 may cover a semiconductor pattern of the transistor TR and may be disposed on (e.g., disposed directly thereon in the third direction DR3) the buffer layer BFL. The gate GT of the transistor TR may be disposed on (e.g., disposed directly thereon in the third direction DR3) the first insulating layer IOL1. The gate GT may be overlapped (e.g., in the third direction DR3) with the channel AC of the transistor TR. According to an embodiment, the gate GT may function as a mask in a process of doping a semiconductor pattern of the transistor TR.

In an embodiment, the gate GT may include at least one of titanium (Ti), silver (Ag), the alloy containing silver (Ag), molybdenum (Mo), the alloy containing molybdenum (Mo), aluminum (Al), the alloy containing aluminum (Al), an aluminum nitride ($AlN_x$), tungsten (W), a tungsten nitride ($WN_x$), copper (Cu), indium tin oxide (ITO), and indium zinc oxide (IZO). However, embodiments of the present disclosure are not necessarily limited thereto.

The first insulating layer IOL1 may include an inorganic layer. The first insulating layer IOL1 may be referred to as a first inorganic layer. For example, in an embodiment the first insulating layer IOL1 may be an inorganic layer which includes at least one of an aluminum oxide, a titanium oxide, a silicon oxide, a silicon nitride, a silicon oxynitride, a zirconium oxide, and a hafnium oxide. The first insulating layer IOL1 may have a single-layer structure or a multi-layer structure. The first insulating layer IOL1 may have a structure in which the plurality of inorganic layers are stacked (e.g., in the third direction DR3). In an embodiment in which the first insulating layer IOL1 has a structure in which a plurality of layers are stacked, the first insulating layer IOL1 may further include a buffer inorganic layer directly disposed under the inorganic layer and having a higher content of oxygen (O), when compared to an adjacent inorganic layer. The buffer inorganic layer may have a physical property similar to that of the buffer insulating layer of the input sensor TSP described above.

In addition, according to an embodiment, the first insulating layer IOL1 may further include an organic layer in addition to the inorganic layer. In an embodiment in which the first insulating layer IOL1 has the structure in which the inorganic layer and the organic layer are stacked (e.g., in the third direction DR3), the first insulating layer IOL1 may further include a buffer inorganic layer interposed between the inorganic layer and the organic layer adjacent to each other. In this embodiment, the buffer inorganic layer may have a physical property similar to that of the buffer insulating layer of the input sensor TSP described above. For example, the buffer inorganic layer may include oxygen (O) and carbon (C) provided at a higher content, when compared to the adjacent inorganic layer.

The multi-layer structure described in relation to the first insulating layer IOL1 may be applied to the second to fourth insulating layer IOL2, IOL3, and IOL4 described thereafter. Accordingly, the stack structure of the insulating layer in the multi-layer structure and the configuration of the buffer inorganic layer in the multi-layer structure may be identically applied even to the second to fourth insulating layer IOL2, IOL3, and IOL4.

The second insulating layer IOL2 may be disposed on (e.g., disposed directly thereon in the third direction DR3) the first insulating layer IOL1 to cover the gate GT. In an embodiment, the second insulating layer IOL2 may commonly overlap the pixels PX (see FIG. 5) (e.g., in the third direction DR3). The second insulating layer IOL2 may include an inorganic layer. The second insulating layer IOL2 may be referred to as a second inorganic layer. For example, in an embodiment the second insulating layer IOL2 may include at least one of silicon oxide, silicon nitride, and silicon oxynitride. The second insulating layer IOL2 may be an inorganic layer and/or an organic layer, and may have a single-layer structure or a multi-layer structure. According to an embodiment, the second insulating layer IOL2 may have a multi-layer structure including a silicon oxide layer and a silicon nitride layer.

The third insulating layer IOL3 may be disposed on the second insulating layer IOL2 (e.g., disposed directly thereon in the third direction DR3). The third insulating layer IOL3 may include an inorganic layer. The third insulating layer IOL3 may be referred to as a third inorganic layer. The third insulating layer IOL3 may have a single-layer structure or a multi-layer structure. According to an embodiment, the third insulating layer IOL3 may have a multi-layer structure including a silicon oxide layer and a silicon nitride layer.

The first connection electrode CNE1 may be disposed on the third insulating layer IOL3 (e.g., disposed directly thereon in the third direction DR3). In an embodiment, the first connection electrode CNE1 may be connected to the signal line SCL through a first contact hole CH-1 formed through the first insulating layer IOL1, the second insulating layer IOL2, and the third insulating layer IOL3.

The fourth insulating layer IOL4 may be disposed on the third insulating layer IOL3 (e.g., disposed directly thereon in the third direction DR3). The fourth insulating layer IOL4 may include an inorganic layer, and may be referred to as a fourth inorganic layer. In an embodiment, the fourth insulating layer IOL4 may be a silicon oxide layer having a single-layer structure.

The fifth insulating layer OML1 may be disposed on the fourth insulating layer IOL4 (e.g., disposed directly thereon in the third direction DR3). The fifth insulating layer OML1 may include an organic layer. The fifth insulating layer OML1 may be referred to as a first organic layer. For example, in an embodiment the first organic layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and a perylene-based resin.

The second connection electrode CNE2 may be disposed on the fifth insulating layer OML1 (e.g., disposed directly thereon in the third direction DR3). In an embodiment, the second connection electrode CNE2 may be connected to the first connection electrode CNE1 through a second contact hole CH-2 formed through the fourth insulating layer IOL4, and the fifth insulating layer OML1.

The sixth insulating layer OML2 may be disposed on the fifth insulating layer OML1 (e.g., disposed directly thereon in the third direction DR3) to cover the second connection electrode CNE2. The sixth insulating layer OML2 may include an organic layer. The sixth insulating layer OML2 may be referred to as a second organic layer. In an embodiment, the second organic layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin.

In an embodiment, the circuit layer DP-CL may further include a plurality of transistors, and may further include signal lines electrically connected to the plurality of transistors. The signal lines may extend and may be connected to the panel pads D-PD (see FIG. 5) of the non-display region NDA (see FIG. 5). In addition, the signal lines may extend and may be connected to the sensing pads T-PD (see FIG. 6) of the non-sensing region NAA-S (see FIG. 6).

The display element layer DP-ED may be disposed on the circuit layer DP-CL (e.g., disposed directly thereon in the third direction DR3). The display element layer DP-ED may include a pixel defining film PDL and the light emitting element LD. The light emitting element LD may include a first electrode AE, a light emitting layer EL, and a second electrode CE.

The first electrode AE may be disposed on the sixth insulating layer OML2 (e.g., disposed directly thereon in the third direction DR3). In an embodiment, the first electrode AE may be connected to the second connection electrode CNE2 through a third contact hole CH-3 formed through the sixth insulating layer OML2. The first electrode AE may be electrically connected to the drain DE of the transistor TR through the first and second connection electrodes CNE1 and CNE2.

The first electrode AE may be referred to as a pixel electrode. In an embodiment, the first electrode AE may include a metal material, a metal alloy, or a conductive compound. The first electrode AE may be an anode or a cathode. In an embodiment, the first electrode AE may be a transmissive electrode, a semi-transmissive electrode, or a reflective electrode. In an embodiment in which the first electrode AE is a transmissive electrode, the first electrode AE may include a transparent metal oxide, for example, indium tin oxide (ITO), indium zinc oxide (IZO), zinc oxide (ZnO), and indium tin zinc oxide (ITZO). In an embodiment in which the first electrode AE is the semi-transmissive electrode or the reflective electrode, the first electrode AE may include at least one of Ag, Mg, Cu, Al, Pt, Pd, Au, Ni, Nd, Ir, Cr, Li, Ca, Mo, Ti, and W, the compound thereof (for example, LiF), the mixture thereof (for example, the mixture of Ag and Mg), or a double-layer structure such as LiF/Ca or LiF/Al. Alternatively, the first electrode AE may have a multi-layer structure including a reflective layer or a semi-transmissive layer formed of the above material and a transparent conductive layer including indium tin oxide (ITO), indium zinc oxide (IZO), zinc oxide (ZnO), and indium tin zinc oxide (ITZO). For example, in an embodiment the first electrode AE may include a three-layer structure of ITO/Ag/ITO. However, embodiments of the present disclosure are not necessarily limited thereto. In an embodiment, the first electrode AE may include the above-described metal material, the combination of at least two types metal materials selected from the above-described metal materials, or an oxide of the above-described metal materials.

A pixel defining film PDL may be disposed on the sixth insulating layer OML2 (e.g., disposed directly thereon in the third direction DR3). According to an embodiment, the pixel defining film PDL may be formed of a polymer resin. For example, the pixel defining film PDL may be formed by including a polyacrylate-based resin or a polyimide-based resin. In addition, the pixel defining film PDL may further include an inorganic material in addition to a polymer resin. In an embodiment, the pixel defining film PDL may be formed by including a light absorbing material, or may be formed by including a black pigment or a black dye. The pixel defining film PDL formed by including a black pigment or a black dye may implement a black pixel defining film. In an embodiment, when the pixel defining film PDL is formed, carbon black may be used as a black pigment or a black dye. However, embodiments of the present disclosure are not necessarily limited thereto.

In addition, the pixel defining film PDL may be formed of an inorganic material. For example, in an embodiment the pixel defining film PDL may include silicon nitride, silicon oxide, or silicon oxynitride.

A pixel opening PX-OP exposing a portion of the first electrode AE may be defined in the pixel defining film PDL. For example, in an embodiment, the pixel defining film PDL may cover lateral edges of the first electrode AE and may expose a central portion of an upper surface of the first electrode AE. According to an embodiment, light emitting regions PXA may be divided by the pixel defining film PDL in the display module DM. The display module DM may include the light emitting regions PXA and a non-light emitting region NPXA. The non-light emitting region NPXA may be overlapped with the pixel defining film PDL (e.g., in the third direction DR3). The light emitting region PXA may overlap (e.g., in the third direction DR3) the portion of the first electrode AE exposed by the pixel opening PX-OP.

The light emitting layer EL in the light emitting element LD may be disposed on the first electrode AE (e.g., in the third direction DR3). According to an embodiment, the light emitting layer EL may emit light having at least one color of blue, red, and green. In an embodiment, the light emitting layer EL may provide blue light in the entire portion of the display region DA (see FIG. 5).

The second electrode CE may be disposed on the light emitting layer EL (e.g., in the third direction DR3). In an embodiment, the second electrode CE may be integrally and commonly disposed in the plurality of pixels PX (see FIG. 5). The second electrode CE may be referred to as a common electrode. The second electrode CE may be a cathode or an anode. For example, in an embodiment in which the first electrode AE is an anode, the second electrode CE may be a cathode. In an embodiment in which the first electrode AE is a cathode, the second electrode CE may be an anode.

In an embodiment, the second electrode CE may be a transmissive electrode, a semi-transmissive electrode, or a reflective electrode. In an embodiment in which the second electrode CE is the transmissive electrode, the second electrode CE may include a transparent metal oxide, for example, indium tin oxide (ITO), indium zinc oxide (IZO), zinc oxide (ZnO), and indium tin zinc oxide (ITZO). The second electrode CE may include at least one of Ag, Mg, Cu, Al, Pt, Pd, Au, Ni, Nd, Ir, Cr, Li, Ca, Mo, Ti, and W, the compound thereof (for example, LiF), the mixture thereof (for example, the mixture of Ag and Mg), or a double-layer structure such as LiF/Ca or LiF/Al.

In an embodiment, a hole control layer may be interposed between the first electrode AE and the light emitting layer EL (e.g., in the third direction DR3). The hole control layer may include a hole transport layer, and may further include a hole injection layer. An electron control layer may be interposed between the light emitting layer EL and the second electrode CE (e.g., in the third direction DR3). The electron control layer may include an electron transport layer, and may further include an electron injection layer. In an embodiment, the hole control layer and the electron control layer may be formed, in common, in the plurality of pixels PX (see FIG. 5) by using an open mask.

An encapsulation layer TFE may be disposed on the display element layer DP-ED (e.g., disposed directly thereon in the third direction DR3). In an embodiment, the encapsulation layer TFE may include a first inorganic layer IL1, an organic layer OL, and a second inorganic layer IL2 sequentially stacked (e.g., in the third direction DR3). However, the layers constituting the encapsulation layer TFE is not necessarily limited thereto.

The inorganic layers IL1 and IL2 may protect the light emitting element LD from moisture and oxygen, and the organic layer OL may protect the light emitting element LD from a foreign substance such as dust particles.

In an embodiment, the inorganic layers IL1 and IL2 may include at least one of silicon nitride, silicon oxynitride, silicon oxide, titanium oxide, and aluminum oxide. The organic layer OL may include an acrylic organic material. However, embodiments of the present disclosure are not necessarily limited thereto and the types of materials constituting the inorganic layers IL1 and IL2 and the organic layer OL may vary.

The input sensor ISP may be disposed on the encapsulation layer TFE (e.g., disposed directly thereon in the third direction DR3). As described with reference to FIG. 4, according to an embodiment, the input sensor ISP may include the sensor insulating layer ISL and the sensor conductive layer MTL.

According to an embodiment, the display module DM may further include the optical layer AF. According to an embodiment, the optical layer AF may be disposed directly on the third sensor insulating layer ISL-T (e.g., in the third direction DR3). However, embodiments of the present disclosure are not necessarily limited thereto. For example, in an embodiment an adhesive layer may be further included between the optical layer AF and the input sensor ISP (e.g., in the third direction DR3).

As illustrated in FIG. 7A, the second sensor conductive layer MTL2 may be connected to the first sensor conductive layer MTL1 through a contact hole CNT. In this embodiment, the first sensor conductive layer MTL1 and the second sensor conductive layer MTL2 may correspond to mesh patterns MSH1 and MSH2 (see FIG. 10A) to be described later, respectively.

Figure 7B:
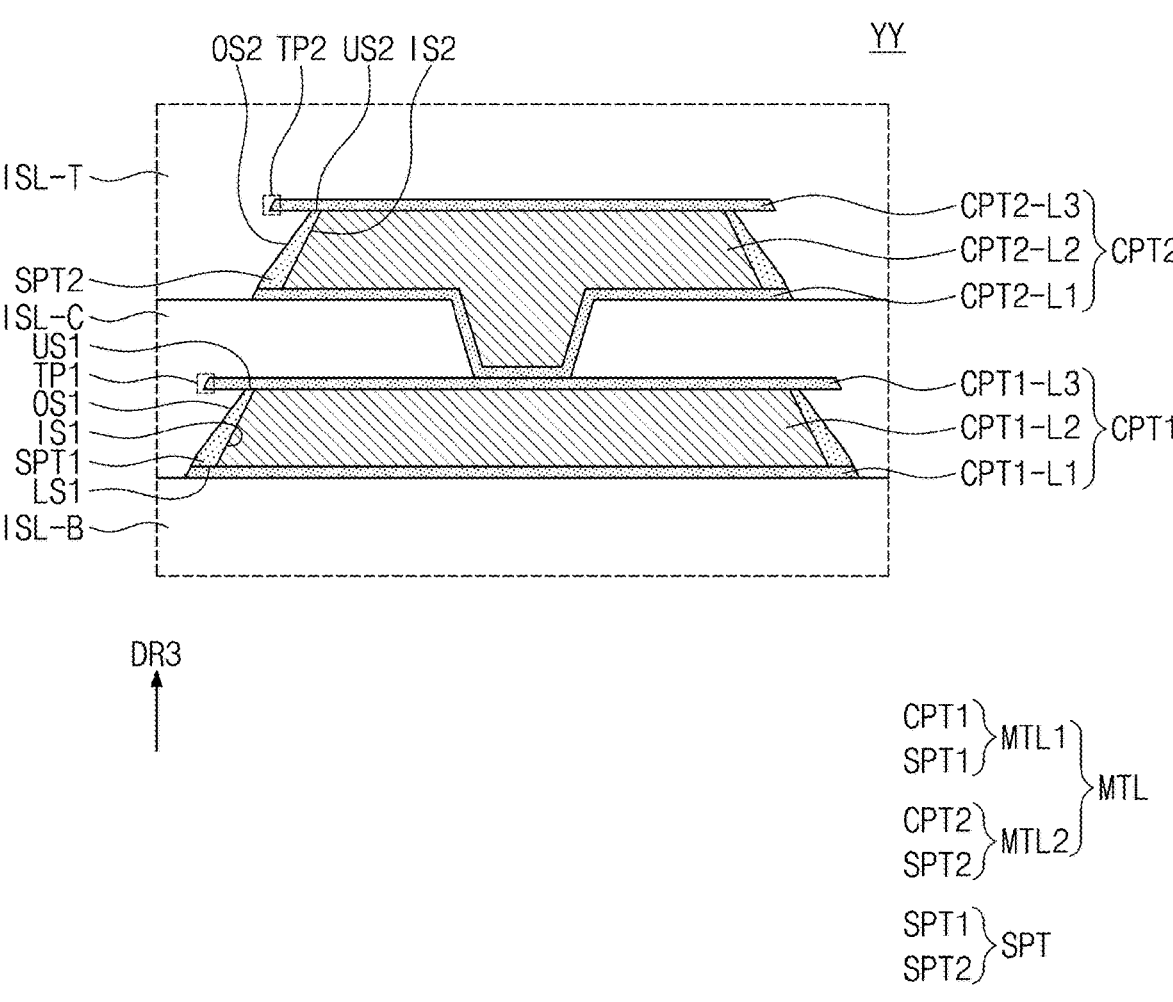
FIG. 7B is an enlarged cross-sectional view illustrating a portion of a display module according to an embodiment of the present disclosure.
Figure 8A:
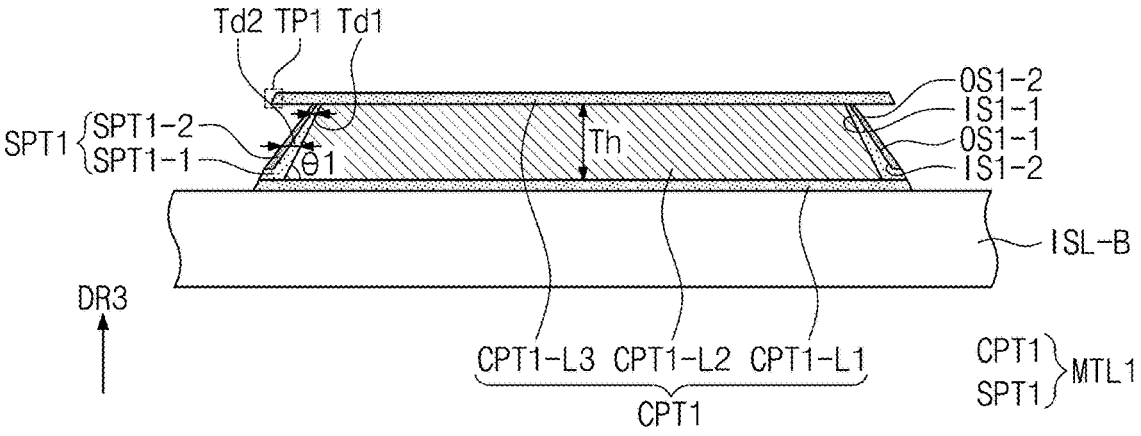
FIGS. 8A to 8C are enlarged cross-sectional views illustrating a conductive layer according to embodiments of the present disclosure.

FIG. 7B is an enlarged cross-sectional view of part YY of FIG. 7A, and FIG. 8A is an enlarged cross-sectional view of a first sensor conductive layer of FIG. 7B.

Referring to FIG. 7B, in an embodiment each of the first sensor conductive layer MTL1 and the second sensor conductive layer MTL2 may be a multi-layer structure. For example, in an embodiment as shown in FIG. 7B the first sensor conductive layer MTL1 may have a stack structure of first to third layers CPT1-L1, CPT1-L2, and CPT1-L3 (e.g., consecutively stacked in the third direction DR3), and the second sensor conductive layer MTL2 may have the stack structure of first to third layers CPT2-L1, CPT2-L2, and CPT2-L3 (e.g., consecutively stacked in the third direction DR3).

For convenience of explanation, the stack structure of the first to third layers CPT1-L1, CPT1-L2, and CPT1-L3 of the first sensor conductive layer MTL1 is defined as a first conductive pattern CPT1, and the stack structure of the first to third layers CPT2-L1, CPT2-L2, and CPT2-L3 of the second sensor conductive layer MTL2 is defined as a second conductive pattern CPT2.

In the first conductive pattern CPT1 and the second conductive pattern CPT2 in the multi-layer structure, metal having higher endurance and lower reflectance may be applied to outer layers of the first conductive pattern CPT1 and the second conductive pattern CPT2, and metal having higher electrical conductivity may be applied to inner layers of the first conductive pattern CPT1 and the second conductive pattern CPT2.

According to an embodiment of the present disclosure, the first layer CPT1-L1 of the first conductive pattern CPT1 may include titanium (Ti), the second layer CPT1-L2 of the first conductive pattern CPT1 may include aluminum (Al), and the third layer CPT1-L3 of the first conductive pattern CPT1 may include titanium (Ti). However, the three-layer structure of the first conductive pattern CPT1 is not necessarily limited thereto. For example, in an embodiment the first layer CPT1-L1 and the third layer CPT1-L3 may include other materials having higher endurance and a lower reflectance, in addition to titanium (Ti). The second layer CPT1-L2 may include other materials having higher electrical conductivity in addition to aluminum (Al). However, embodiments of the present disclosure are not necessarily limited thereto.

In an embodiment, the second layer CPT1-L2 of the first conductive pattern CPT1 may have a tapered shape when viewed in a cross-sectional view. For example, the second layer CPT1-L2 of the first conductive pattern CPT1 may have a width that decreases as a distance to the third layer CPT1-L3 of the first conductive pattern CPT1 decreases.

The third layer CPT1-L3 of the first conductive pattern CPT1 may include a tip part TP1 protruding beyond a side surface of the second layer CPT1-L2. For example, in an embodiment the first conductive pattern CPT1 may be under-cut, and a step part may be defined between the second layer CPT1-L2 of the first conductive pattern CPT1 and the third layer CPT1-L3 of the first conductive pattern CPT1.

In an embodiment, the second conductive pattern CPT2 may have a stack structure that is the same as that of the first conductive pattern CPT1, and the second layer CPT2-L2 of the second conductive pattern CPT2 and the third layer CPT2-L3 of the second conductive pattern CPT2 may be substantially the same as the second layer CPT1-L2 of the first conductive pattern CPT1 and the third layer CPT1-L3 of the first conductive pattern CPT1.

The first sensor conductive layer MTL1 and the second sensor conductive layer MTL2 may include a first protective pattern SPT1 and a second protective pattern SPT2 to cover side surfaces of the second layer CPT1-L2 of the first conductive pattern CPT1 and the second layer CPT2-L2 of the second conductive pattern CPT2, respectively.

In an embodiment, a side surface IS1 of the first protective pattern SPT1 (e.g., a lateral side surface) may directly contact a side surface (e.g., a lateral side surface) of the second layer CPT1-L2. For example, in an embodiment, the side surface IS1 of the first protective pattern SPT1 may cover an entirety of the side surface of the second layer CPT1-L2. A top surface US1 of the first protective pattern SPT1 may directly contact a bottom surface of the third layer CPT1-L3. A bottom surface LS1 of the first protective pattern SPT1, which is opposite to the top surface US1 of the first protective pattern SPT1 (e.g., in the third direction DR3), may directly contact the top surface of the first layer CPT1-L1.

In an embodiment, an outer surface OS1, which is opposite to the side surface IS1 of the first protective pattern SPT1, may be exposed. In an embodiment, the outer surface OS1 of the first protective pattern SPT1 and the tip part TP1 of the third layer CPT1-L3 of the first conductive pattern CPT1 may have an undercut shape, when viewed in a cross-sectional view.

The first protective pattern SPT1 may cover the side surfaces (e.g., lateral side surfaces) of the second layer CPT1-L2 of the first conductive pattern CPT1 to prevent the second layer CPT1-L2 of the first conductive pattern CPT1 from being exposed.

In an embodiment, the second protective pattern SPT2 may be substantially the same as the first protective pattern SPT1 in stack structure and shape. In an embodiment, a top surface US2 of the second protective pattern SPT2 may directly contact a bottom surface of the third layer CPT2-L3. In an embodiment, an outer surface OS2, which is opposite to the side surface IS2 of the second protective pattern SPT2, may be exposed. In an embodiment, the outer surface OS2 of the second protective pattern SPT2 and the tip part TP2 of the third layer CPT2-L3 of the second conductive pattern CPT2 may have an undercut shape, when viewed in a cross-sectional view.

For convenience of explanation, only the first sensor conductive layer MTL1 among the first sensor conductive layer MTL1 and the second sensor conductive layer MTL2 of FIG. 7A will be described below. However, the following description is not necessarily limited only to the first sensor conductive layer MTL1, but may be similarly applied to the second sensor conductive layer MTL2.

Referring to FIG. 8A, according to an embodiment of the present disclosure, the second layer CPT1-L2 of the first conductive pattern CPT1 may have a tapered shape, when viewed in a cross-sectional view. In this embodiment, a taper angle $\theta1$ of the second layer CPT1-L2 of the first conductive pattern CPT1, which is defined as an angle between the side surface of the second layer CPT1-L2 of the first conductive pattern CPT1 and the top surface of the first layer CPT1-L1 of the first conductive pattern CPT1, may be in the range of about 60 degrees to about 90 degrees. As the taper angle $\theta1$ of the second layer CPT1-L2 of the first conductive pattern CPT1 may be in the range of about 60 degrees to about 90 degrees, a preliminary protective pattern may be easily etched such that the protective pattern has a desired shape in a process of etching the preliminary protective pattern (see FIGS. 11C and 11D).

However, embodiments of the present disclosure are not necessarily limited thereto. For example, in an embodiment, the tapered angle $\theta1$ between the side surface of the second layer CPT1-L2 of the first conductive pattern CPT1 and the top surface of the first layer CPT1-L1 of the first conductive pattern CPT1 may be about 90 degrees.

In an embodiment, a thickness Th of the second layer CPT1-L2 of the first conductive pattern CPT1 may be about 2500 Å (angstrom). In an embodiment, to additionally increase the reliability of signal transmission for an external input, the thickness Th of the second layer CPT1-L2 of the first conductive pattern CPT1 may be more than about 6000 Å (angstrom).

The first protective pattern SPT1 may have a reflectance that is less than that of the second layer CPT1-L2 of the first conductive pattern CPT1. For example, the first protective pattern SPT1 may include a material having a reflectance that is less than a reflectance of the second layer CPT1-L2 of the first conductive pattern CPT1. In an embodiment, the first protective pattern SPT1 may include a material having a reflectance that is less than that of aluminum (Al) of the second layer CPT1-L2 of the first conductive pattern CPT1. For example, in an embodiment the first protective pattern SPT1 may include molybdenum and tantalum, and may include molybdenum tantalum oxide (MTO). However, embodiments of the present disclosure are not necessarily limited thereto.

In an embodiment in which the thickness Th of the second layer CPT1-L2 of the first conductive pattern CPT1 is greater than or equal to about 6000 Å (angstrom), a region in which light is reflected of the side surface of the second layer CPT1-L2 of the first conductive pattern CPT1 may be increased. The first protective pattern SPT1 may cover a side surface of the second layer CPT1-L2 of the first conductive pattern CPT1 to decrease the region in which light is reflected. In addition, since the first protective pattern SPT1 has reflectance that is less than a reflectance of the second layer CPT1-L2 of the first conductive pattern CPT1, an amount of light reflected in the same area may be reduced. Accordingly, the first conductive pattern CPT1 may be prevented from being viewed from the outside.

In an embodiment, the first protective pattern SPT1 may have a thickness Td2 that is irregular along the side surface of the second layer CPT1-L2 of the first conductive pattern CPT1. For example, the thickness Td2 of the first protective pattern SPT1 may be irregular in the third direction DR3. In the process (see FIGS. 11C and 11D) of etching the preliminary protective pattern, as a protective pattern may be formed through anisotropic etching (for example, dry etching), the thickness Td2 of the first protective pattern SPT1 may be irregular.

For example, when viewed in a direction crossing the third direction DR3, the thickness Td2 of the first protective pattern SPT1 may be reduced in a direction away from the first layer CPT1-L1 of the first conductive pattern CPT1. In addition, when viewed in the direction crossing the third direction DR3, the thickness Td2 of the first protective pattern SPT1 may be equal in some range. However, embodiments of the present disclosure are not necessarily limited thereto.

In an embodiment, the first protective pattern SPT1 may include a first protective pattern layer SPT1-1 and a second protective pattern layer SPT1-2. The first protective pattern layer SPT1-1 may directly contact a side surface (e.g., a lateral side surface) of the second layer CPT1-L2 of the first conductive pattern CPT1. The second protective pattern layer SPT1-2 may directly contact the side surface (e.g., an outer lateral side surface) of the first protective pattern layer SPT1-1. In addition, in an embodiment the second protective pattern layer SPT1-2 may cover the first protective pattern layer SPT1-1.

In an embodiment, an inner surface IS1-1 of the first protective pattern layer SPT1-1 may directly contact the side surface (e.g., the lateral side surface) of the second layer CPT1-L2, and an outer surface OS1-1 of the first protective pattern layer SPT1-1 may directly contact an inner surface IS1-2 of the second protective pattern layer SPT1-2. An outer surface OS1-2 of the second protective pattern layer SPT1-2 is exposed. The outer surface OS1-1 of the first protective pattern layer SPT1-1 may directly contact with the inner surface IS1-2 of the second protective pattern layer SPT1-2, and the second protective pattern layer SPT1-2 may be spaced apart from the side surface of the second layer CPT1-L2 with the first protective pattern layer SPT1-1 interposed between the second protective pattern layer SPT1-2 and the side surface of the second layer CPT1-L2.

In an embodiment, a portion of the outer surface OS1-1 of the first protective pattern layer SPT1-1 and the outer surface OS1-2 of the second protective pattern layer SPT1-2 may be exposed to define the outer surface of the first protective pattern SPT1. For example, the outer surface OS1-1 of the first protective pattern layer SPT1-1 may form a lower portion of the outer surface of the first protective pattern SPT1.

In an embodiment, the first protective pattern layer SPT1-1 may be protected from being etched in the process of etching the preliminary protective pattern (see FIGS. 11C and 11D), which will be described later, by allowing the second protective pattern layer SPT1-2 to cover the first protective pattern layer SPT1-1.

In an embodiment, the first protective pattern layer SPT1-1 and the second protective pattern layer SPT1-2 may include mutually different materials from each other. For example, in an embodiment the first protective pattern layer SPT1-1 may include molybdenum or tantalum, and the second protective pattern layer SPT1-2 may include silicon oxide, silicon nitride, silicon oxynitride, or amorphous silicon. The first protective pattern layer SPT1-1 may include a material having a reflectance that is less than that of the second protective pattern layer SPT1-2.

According to an embodiment of the present disclosure, the first protective pattern layer SPT1-1 may have a refractive index greater than or equal to that of the second protective pattern layer SPT1-2. For example, when the wavelength of light is 633 nm, the first protective pattern layer SPT1-1 may include molybdenum tantalum oxide (MTO) which is a material having the refractive index of 1.806. When the wavelength of light is 633 nm, the second protective pattern layer SPT1-2 may include silicon nitride (SiN$_x$) which is a material having a refractive index of 1.805. For example, when the wavelength of light is 633 nm, the second protective pattern layer SPT1-2 may include silicon oxynitride (SiO$_x$N$_y$) which is a material having the refractive index of 1.790.

However, the materials constituting the first protective pattern layer SPT1-1 and the second protective pattern layer SPT1-2 are not necessarily limited thereto.

In an embodiment, a thickness Td1 of the first protective pattern layer SPT1-1 may be greater than or equal to about 200 Å. In addition, the thickness Td1 of the first protective pattern layer SPT1-1 may be greater than or equal to about 300 Å. The thickness Td1 of the first protective pattern layer SPT1-1 may be greater than or equal to about 300 Å to prevent light from the first protective pattern layer SPT1-1 and the second layer CPT1-L2 of the first conductive pattern CPT1 from being reflected. In this embodiment, the minimum thickness Td1 (e.g., a minimum thickness value or a minimum width value) of the first protective pattern layer SPT1-1 may be greater than or equal to about 300 Å.

Figure 8B:
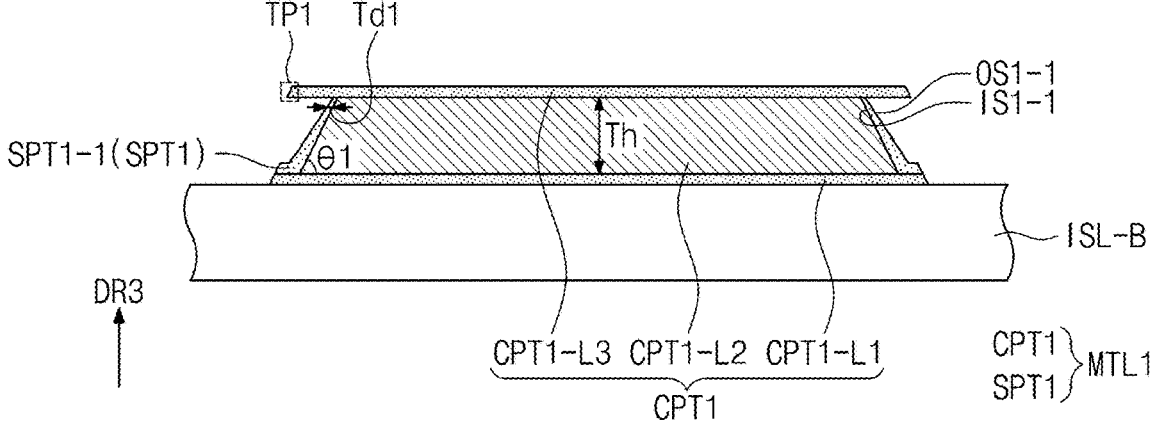
Figure 8C:
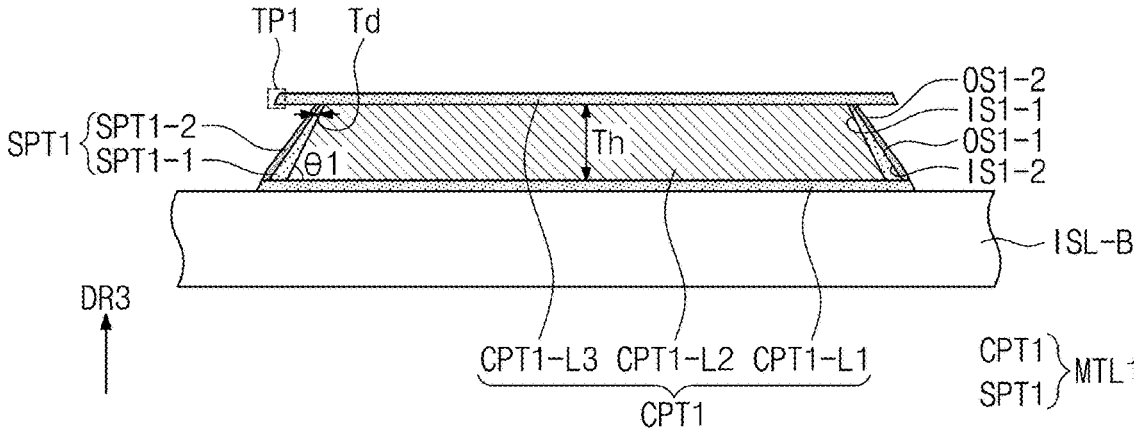

FIG. 8B and FIG. 8C are cross-sectional views of the first sensor conductive layer MTL1 according to another example of the first protective pattern SPT1 of FIG. 8A.

Referring to FIG. 8B, the second protective pattern layer SPT1-2 may be omitted from the first protective pattern SPT1. For example, in an embodiment an entirety of a second preliminary protective pattern layer P-SPT1-2 (see FIG. 11D) is removed in the process of etching the preliminary protective pattern (see FIGS. 11C and 11D), and only the entirety or a portion of a first preliminary protective pattern layer P-SPT1-1 (see FIG. 11D) may remain on the second layer CPT1-L2. In this embodiment, the first protective pattern layer SPT1-1 may not be exposed to etching (see FIG. 11D) by the tip part TP1 of the third layer CPT1-L3 of the first conductive pattern CPT1 in the process of etching the preliminary protective pattern (see FIGS. 11C and 11D).

In this embodiment, the thickness Td1 of the first protective pattern layer SPT1-1 may be greater than or equal to about 300 Å and irregular in the third direction DR3. However, embodiments of the present disclosure are not necessarily limited thereto.

A portion of the first protective pattern layer SPT1-1 may cover the first layer CPT1-L1 of the first conductive pattern CPT1. The remaining portion of the first protective pattern layer SPT1-1 may cover the entirety of the side surface of the second layer CPT1-L2 of the first conductive pattern CPT1 such that the entirety of the first protective pattern layer SPT1-1 is not exposed to etching by the tip part TP1 of the third layer CPT1-L3 of the first conductive pattern CPT1. Accordingly, the first conductive pattern CPT1 may be prevented from being viewed to the outside.

Referring to FIG. 8C, the first protective pattern layer SPT1-1 and the second protective pattern layer SPT1-2 may directly contact the third layer CPT1-L3 of the first conductive pattern CPT1 and the first layer CPT1-L1 of the first conductive pattern CPT1.

For example, the inner surface IS1-1 of the first protective pattern SPT1 may be defined by the first protective pattern layer SPT1-1, the top and bottom surfaces of the first protective pattern SPT1 may be defined by the first protective pattern layer SPT1-1 and the second protective pattern layer SPT1-2, and the outer surface OS1-2 of the first protective pattern SPT1 may be defined solely by the second protective pattern layer SPT1-2.

In an embodiment, the second protective pattern layer SPT1-2 may cover the entirety of the first protective pattern layer SPT1-1, and the first protective pattern layer SPT1-1 may cover the entirety of the side surface of the second layer CPT1-L2 of the first conductive pattern CPT1.

Figure 9A:
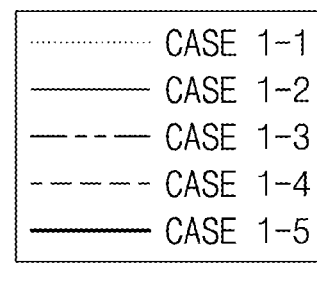
FIGS. 9A and 9B are graphs illustrating the reflectance of conductive patterns according to embodiments of the present disclosure, and illustrating the reflectance of conductive patterns according to a comparative example.
Figure 9A:
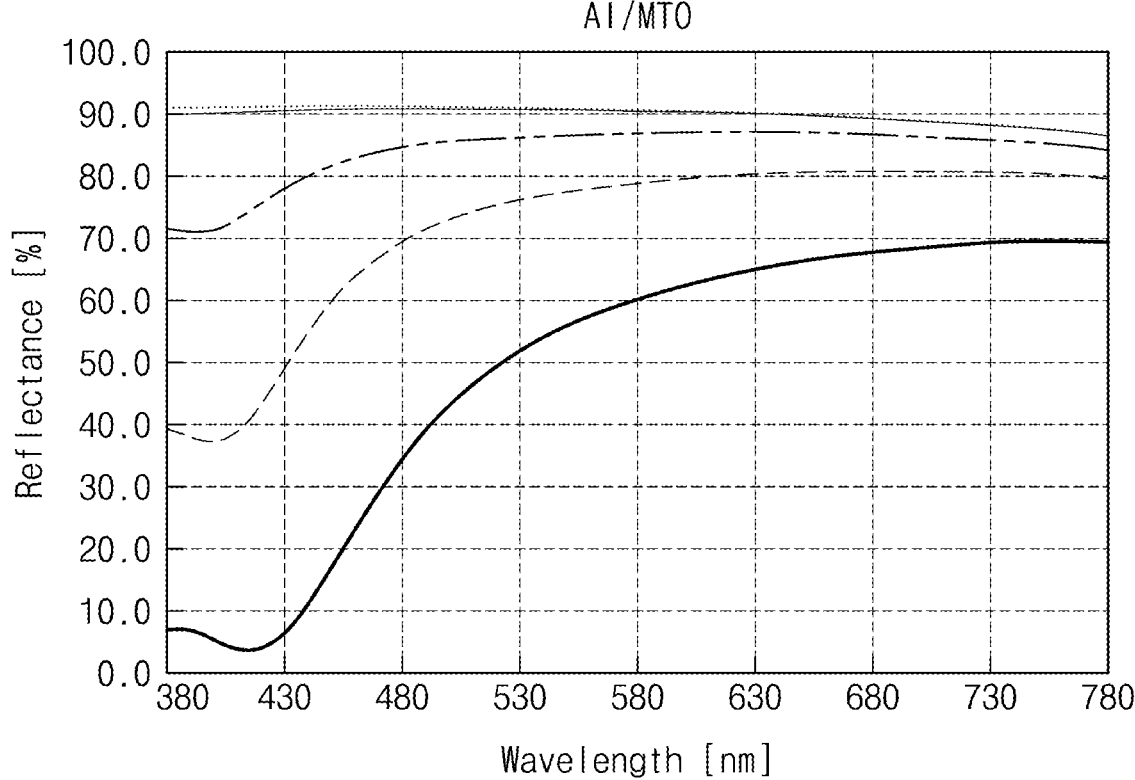
Figure 9B:
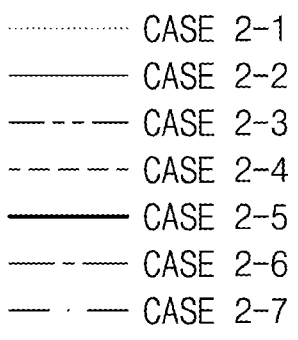
Figure 9B:
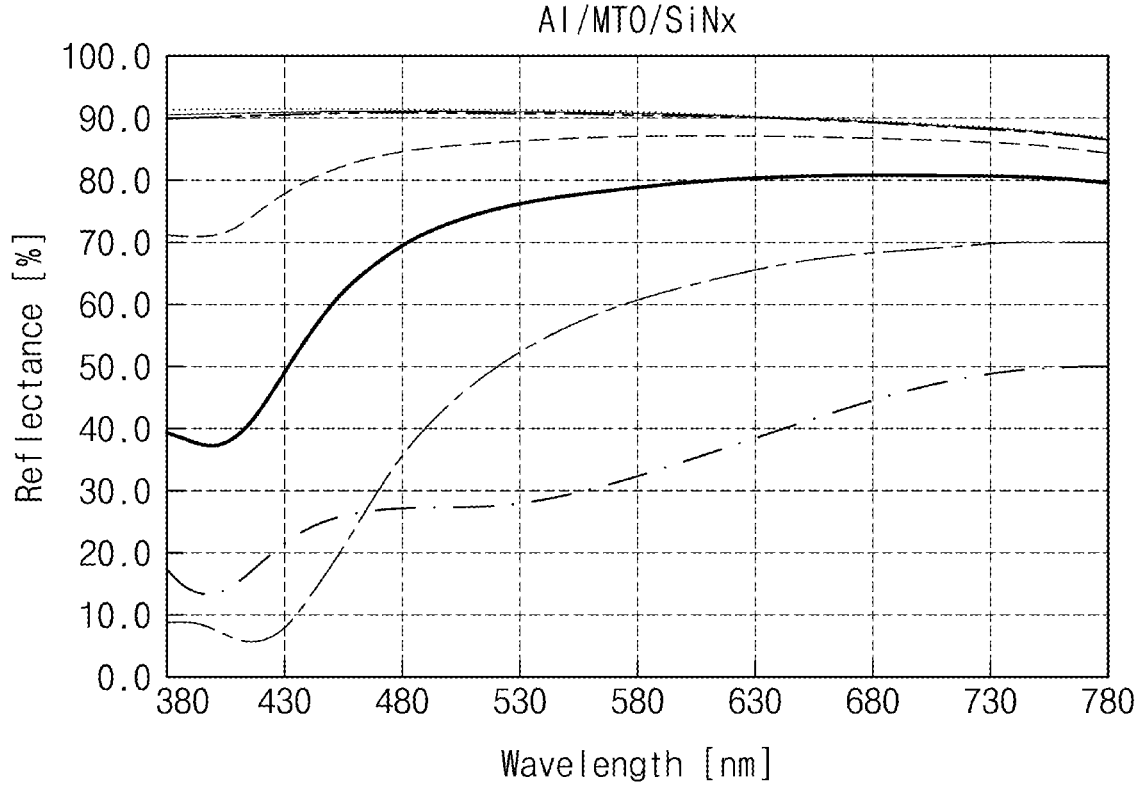

FIGS. 9A and 9B are graphs illustrating the reflectance of a sensor conductive layer according to embodiments of the present disclosure, and illustrating the reflectance of sensor conductive layer according to a comparative example.

Referring to FIGS. 9A and 9B, the first sensor conductive layers MTL1 (see FIG. 8A) may have mutually different reflectances or the same reflectance depending on the thickness of the first protective pattern SPT1 (see FIG. 8A). Hereinafter, only the first sensor conductive layer MTL1 (see FIG. 8A) will be described. However, the description of the first sensor conductive layer MTL1 may be similarly applied to the second sensor conductive layer MTL2 (see FIG. 7B).

Cases of FIG. 9A show that the first protective pattern layer SPT1-1 (see FIG. 8A) has various thicknesses in the first protective pattern SPT1 (see FIG. 8A) while the thickness of the second protective pattern layer SPT1-2 (see FIG. 8A) is not changed.

CASE 1-1 shows a case where the thickness of the first protective pattern layer SPT1-1 (see FIG. 8A) is 0 Å.

CASE 1-2 shows a case where the first protective pattern layer SPT1-1 (see FIG. 8A) includes molybdenum tantalum oxide (MTO), and has the thickness of 10 Å.

CASE 1-3 shows a case where the first protective pattern layer SPT1-1 (see FIG. 8A) includes molybdenum tantalum oxide (MTO), and has the thickness of 100 Å.

CASE 1-4 shows a case where the first protective pattern layer SPT1-1 (see FIG. 8A) includes molybdenum tantalum oxide (MTO), and has the thickness of 200 Å.

CASE 1-5 shows a case where the first protective pattern layer SPT1-1 (see FIG. 8A) includes molybdenum tantalum oxide (MTO), and has the thickness of 300 Å.

In CASE 1-1 and CASE 1-2, when the wavelength of light incident onto the second layer CPT1-L2 (see FIG. 8A) of the first conductive pattern CPT1 (see FIG. 8A) is 630 nm, the reflectance is about 90%.

In CASE 1-3, when the wavelength of light incident onto the second layer CPT1-L2 (see FIG. 8A) of the first conductive pattern CPT1 (see FIG. 8A) is 630 nm, the reflectance is about 85%.

In CASE 1-4, when the wavelength of light incident onto the second layer CPT1-L2 (see FIG. 8A) of the first conductive pattern CPT1 (see FIG. 8A) is 630 nm, the reflectance is about 80%.

In CASE 1-5, when the wavelength of light incident onto the second layer CPT1-L2 (see FIG. 8A) of the first conductive pattern CPT1 (see FIG. 8A) is 630 nm, the reflectance is about 65%.

As the thickness of the first protective pattern layer SPT1-1 (see FIG. 8A) is increased, the reflectance is decreased, such that the first sensor conductive layer MTL1 (see FIG. 8A) is prevented being viewed from the outside. Accordingly, the first sensor conductive layer MTL1 (see FIG. 8A) is prevented being viewed from the outside in CASE 1-3, CASE 1-4, and CASE 1-5, when compared to CASE 1-1 and CASE 1-2

Cases of FIG. 9B show that the first protective pattern SPT1 (see FIG. 8A) has various thicknesses in the first protective pattern layer SPT1-1 (see FIG. 8A) and the second protective pattern layer SPT1-2 (see FIG. 8A).

CASE 2-1 shows a case where the thicknesses of the first protective pattern layer SPT1-1 (see FIG. 8A) and the second protective pattern layer SPT1-2 (see FIG. 8A) are 0 Å. CASE 2-1 shows the same embodiment that of CASE1-1.

CASE 2-2 shows a case where the first protective pattern layer SPT1-1 (see FIG. 8A) includes molybdenum tantalum oxide (MTO), and has the thickness of 10 Å. CASE 2-1 shows the same embodiment that of CASE1-2.

CASE2-3 shows a case where the first protective pattern layer SPT1-1 (see FIG. 8A) includes molybdenum tantalum oxide (MTO), and has the thickness of 10 Å, and the second protective pattern layer SPT1-2 (see FIG. 8A) includes silicon nitride ($SiN_x$) and the thickness is 10 Å.

CASE 2-4 shows a case where the first protective pattern layer SPT1-1 (see FIG. 8A) includes molybdenum tantalum oxide (MTO), and has the thickness of 100 Å, and the second protective pattern layer SPT1-2 (see FIG. 8A) includes silicon nitride ($SiN_x$) and the thickness is 10 Å.

CASE 2-5 shows a case where the first protective pattern layer SPT1-1 (see FIG. 8A) includes molybdenum tantalum oxide (MTO), and has the thickness of 200 Å, and the second protective pattern layer SPT1-2 (see FIG. 8A) includes silicon nitride ($SiN_x$) and the thickness is 10 Å.

CASE 2-6 shows a case where the first protective pattern layer SPT1-1 (see FIG. 8A) includes molybdenum tantalum oxide (MTO), and has the thickness of 300 Å, and the second protective pattern layer SPT1-2 (see FIG. 8A) includes silicon nitride ($SiN_x$) and the thickness is 10 Å.

CASE 2-7 shows a case where the first protective pattern layer SPT1-1 (see FIG. 8A) includes molybdenum tantalum oxide (MTO), and has the thickness of 300 Å, and the second protective pattern layer SPT1-2 (see FIG. 8A) includes silicon nitride ($SiN_x$) and the thickness is 350 Å.

In CASE 2-1, CASE 2-2, and CASE 2-3, when the wavelength of light incident onto the second layer CPT1-L2 (see FIG. 8A) of the first conductive pattern CPT1 (see FIG. 8A) is 630 nm, the reflectance is about 90%.

In CASE 2-4, when the wavelength of light incident onto the second layer CPT1-L2 (see FIG. 8A) of the first conductive pattern CPT1 (see FIG. 8A) is 630 nm, the reflectance is about 85%.

In CASE 2-5, when the wavelength of light incident onto the second layer CPT1-L2 (see FIG. 8A) of the first conductive pattern CPT1 (see FIG. 8A) is 630 nm, the reflectance is about 80%.

In CASE 2-6, when the wavelength of light incident onto the second layer CPT1-L2 (see FIG. 8A) of the first conductive pattern CPT1 (see FIG. 8A) is 630 nm, the reflectance is about 65%.

In CASE 2-7, when the wavelength of light incident onto the second layer CPT1-L2 (see FIG. 8A) of the first conductive pattern CPT1 (see FIG. 8A) is 630 nm, the reflectance is about 40%.

When the thickness of the first protective pattern layer SPT1-1 (see FIG. 8A) is about the specific thickness that is greater than or equal to about 100 Å, as the thickness of the second protective pattern layer SPT1-2 (see FIG. 8A) is increased, the reflectance is reduced, thereby preventing the first sensor conductive layer MTL1 (see FIG. 8A) from being viewed from the outside. As the thickness of the first protective pattern layer SPT1-1 (see FIG. 8A) is increased, the reflectance is further decreased, such that the first sensor conductive layer MTL1 (see FIG. 8A) is further prevented from being viewed from the outside.

Accordingly, the smaller reflectance is shown and the first sensor conductive layer MTL1 (see FIG. 8A) is further prevented being viewed from the outside in CASE 2-5, when compared to CASE 2-1, CASE 2-2, CASE 2-3 and CASE 2-4. The first sensor conductive layer MTL1 (see FIG. 8A) is further prevented being viewed from the outside in CASE 2-6, when compared to CASE 2-5. The first sensor conductive layer MTL1 (see FIG. 8A) is further prevented being viewed from the outside in CASE 2-7, when compared to CASE 2-6.

Figure 10A:
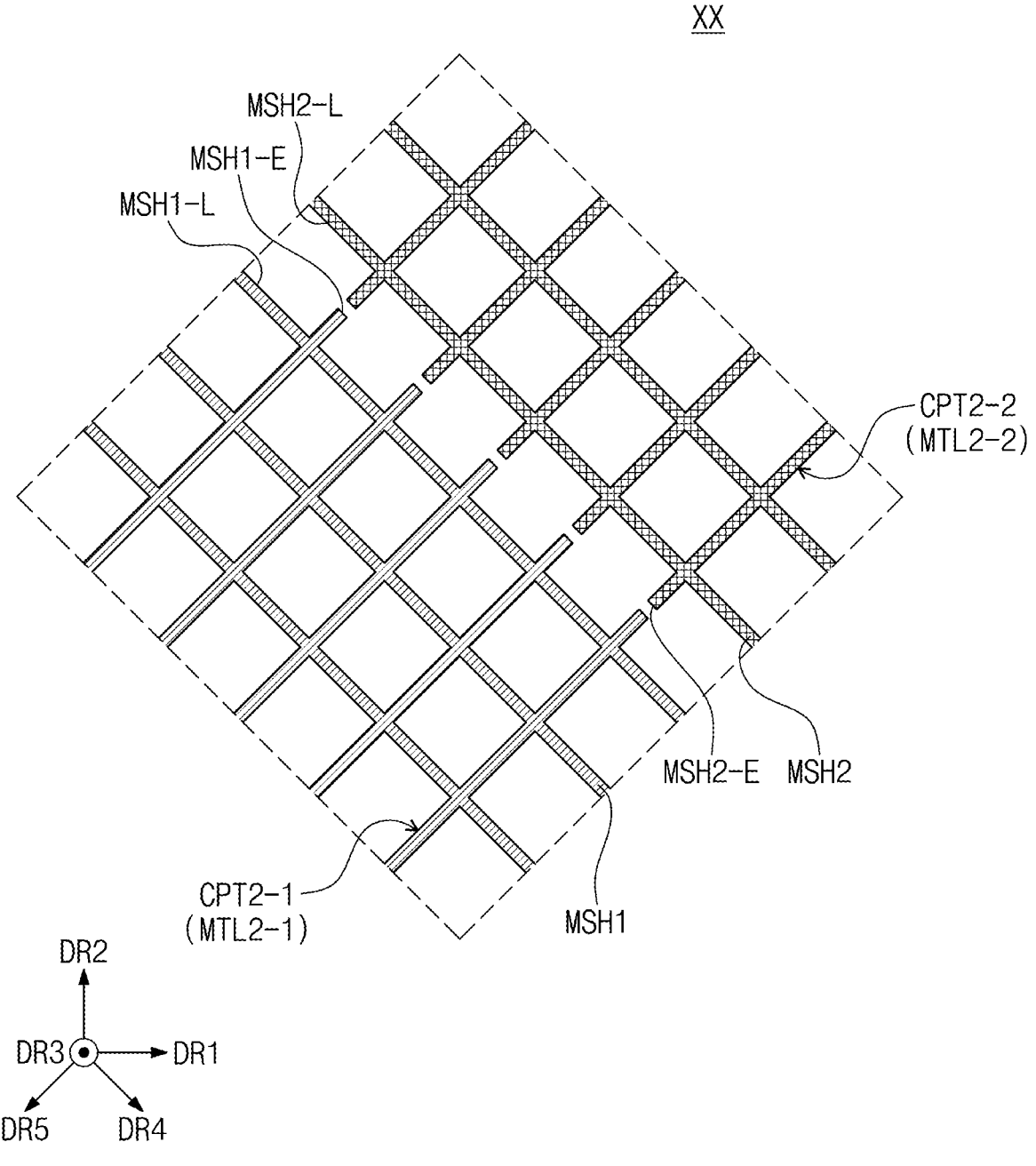
FIGS. 10A and 10B are enlarged plan views illustrating a portion of an input sensor according to embodiments of the present disclosure.
Figure 10B:
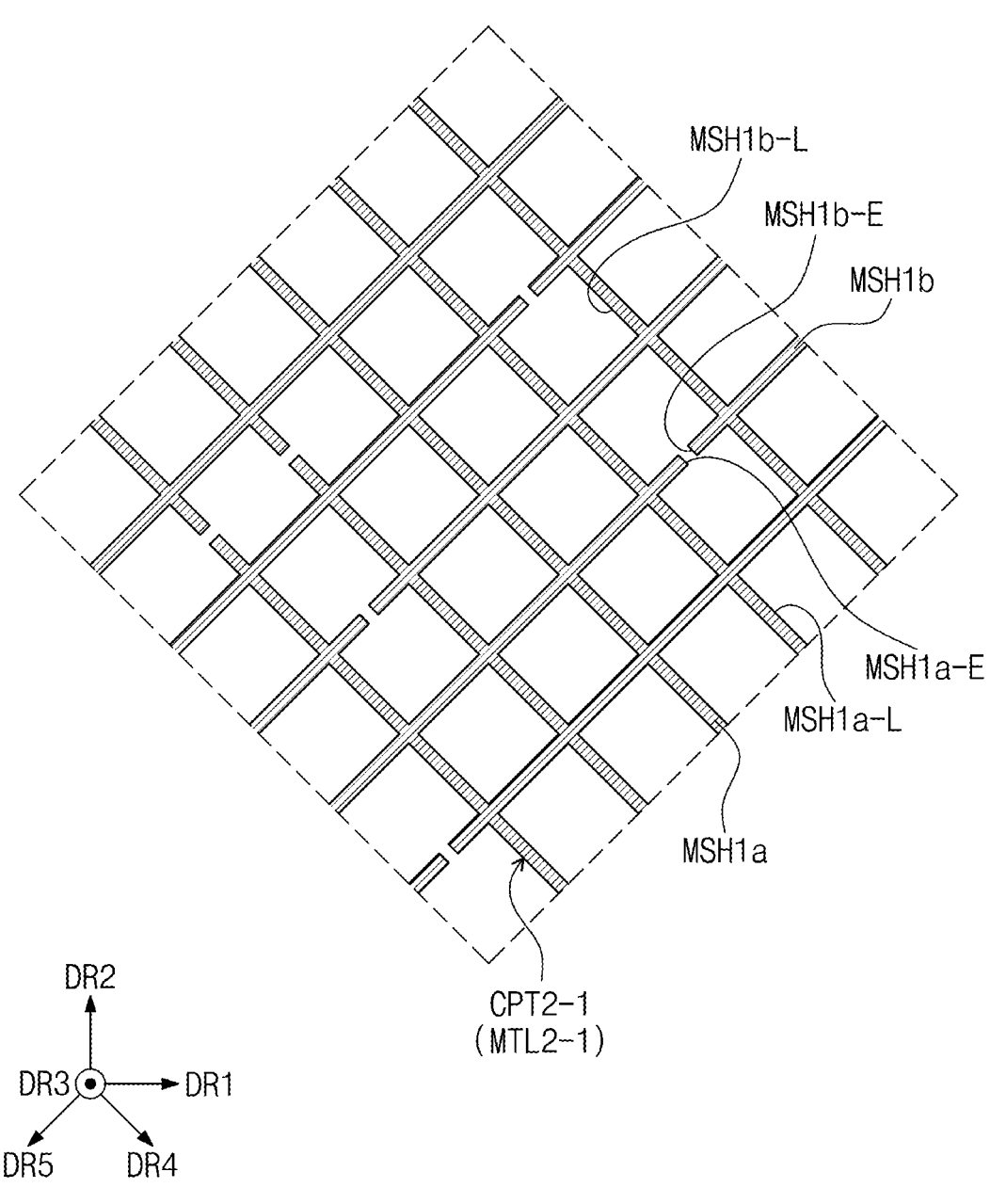

FIGS. 10A and 10B are enlarged plan views illustrating a portion of an input sensor according to an embodiment of the present disclosure. In detail, FIG. 10A is an enlarged view illustrating part XX of FIG. 6.

In the following description made with reference to FIG. 10A, a fourth direction DR4 and a fifth direction DR5 are defined to be different from the first direction DR1 and the second direction DR2 while crossing the third direction DR3.

Referring to FIG. 10A, in an embodiment the first sensing electrodes TE1 (see FIG. 6) described with reference to FIG. 6 and the second sensing electrode TE2 (see FIG. 6) may include mesh patterns MSH1 and MSH2, respectively. For example, the first sensor patterns SP1 (see FIG. 6), the first connection patterns BP1 (see FIG. 6), the second sensor patterns SP2 (see FIG. 6), and the second connection patterns BP2 (see FIG. 6) may include the mesh patterns MSH1 and MSH2. In an embodiment, the plurality of mesh patterns MSH1 and MSH2 may extend in the fourth direction DR4 and the fifth direction DR5, when viewed in a plan view. The second sensor conductive layer MTL2 may comprise 2-1 sensor conductive layer MTL2-1 and 2-2 sensor conductive layer MTL2-2. The second conductive pattern CPT2 may comprise 2-1 conductive pattern CPT2-1 and 2-2 conductive pattern CPT2-2. The 2-1 sensor conductive layer MTL2-1 may comprise the 2-1 conductive pattern CPT2-1, and the 2-2 sensor conductive layer MTL2-2 may comprise the 2-2 conductive pattern CPT2-2.

The plurality of mesh patterns MSH1 and MSH2 may include the first mesh pattern MSH1 and the second mesh pattern MSH2, which are spaced apart from each other (e.g., in the fifth direction DR5). In an embodiment, the first mesh pattern MSH1 may include a first mesh line MSH1-L extending in the fourth direction DR4 or the fifth direction DR5, when viewed in a plan view. The second mesh pattern MSH2 may include a second mesh line MSH2-L extending in the fourth direction DR4 or the fifth direction DR5, when viewed in a plan view.

According to an embodiment of the present disclosure, the first mesh pattern MSH1 may correspond to the first sensor pattern SP1 (see FIG. 6), and the second mesh pattern MSH2 may correspond to the second sensor pattern SP2 (see FIG. 6). However, embodiments of the present disclosure are not necessarily limited thereto. For example, in an embodiment the first mesh pattern MSH1 may correspond to the first sensor pattern SP1 (see FIG. 6) or the second sensor pattern SP2 (see FIG. 6), and the second mesh pattern MSH2 may correspond to the first connection pattern BP1 (see FIG. 6) or the second connection pattern BP2 (see FIG. 6). However, embodiments of the present disclosure are not necessarily limited thereto.

The first mesh pattern MSH1 may include a first edge MSH1-E formed by cutting the first mesh line MSH1-L in a direction crossing a direction in which the first mesh line MSH1-L extends (e.g., the fourth direction DR4). The second mesh pattern MSH2 may include a second edge MSH2-E formed by cutting the second mesh line MSH2-L in a direction crossing a direction in which the second mesh line MSH2-L extends (e.g., the fourth direction DR4). The first edge MSH1-E and the second edge MSH2-E may define a minimum distance between the first mesh pattern MSH1 and the second mesh pattern MSH2. A plurality of first edges MSH1-E and a plurality of second edges MSH2-E may be provided.

A cutting part may be defined between the first mesh pattern MSH1 and the second mesh pattern MSH2. The first edge MSH1-E of the first mesh pattern MSH1 may define one side of a cutting part to be described later, and the second edge MSH2-E may define another side of the cutting part. The first edge MSH1-E and the second edge MSH2-E may define widths of the cutting part.

The cutting part is a part in which the mesh pattern is omitted, and is a part defined by the first edge MSH1-E and the second edge MSH2-E. The position in which the cutting part is formed has a reflectance that is less than a reflectance at a position in which the mesh pattern is formed. Accordingly, the position having the cutting part may be specifically viewable from the outside by a user. For example, a region between the first edge MSH1-E of the first mesh pattern MSH1 and the second edge MSH2-E of the second mesh pattern MSH2 may be specifically viewed from the outside. In addition, in an embodiment the position having the cutting part may be defined in a periodical structure in the fourth direction DR4 as illustrated in drawings. However, embodiments of the present disclosure are not necessarily limited thereto. For example, in some embodiments the position having the cutting part may be defined in an aperiodic structure.

In an embodiment, as the thickness Th (see FIG. 8A) of the second layer CPT1-L2 (see FIG. 8A) of the first conductive pattern CPT1 (see FIG. 8A) is greater than or equal to about 6000 Å, a region in which light is reflected from a side surface of the second layer CPT1-L2 (see FIG. 8A) of the first conductive pattern CPT1 (see FIG. 8A) is increased. Accordingly, the difference between the reflectance of the first edge MSH1-E and the reflectance of the second edge MSH2-E, and the reflectance of the cut part is increased. Accordingly, the cut part may be more specifically viewed from the outside.

In addition, the cut part defined by the first edge MSH1-E and the second edge MSH2-E may be positioned in a periodic structure in the fourth direction DR4, which increases the user's ability to view the cut part from the outside. However, embodiments of the present disclosure are not necessarily limited thereto, and the cut part may be positioned in an aperiodic structure. In addition, even when the cut part is positioned in the aperiodic structure, the cut part may be specifically viewed from the outside by the user.

According to an embodiment of the present disclosure, a protective pattern SPT (see FIG. 7B) is positioned at each of the edges MSH1-E and MSH2-E of the mesh patterns MSH1 and MSH2, such that the reflectance of each of the edges MSH1-E and MSH2-E of the mesh patterns MSH1 and MSH2 are lowered to reduce the difference in the reflectance from the cut part, thereby preventing the position having the cut part from being specifically viewed by the user.

In addition, as the protective pattern SPT (see FIG. 7B) is positioned in the direction in which the first mesh line MSH1-L and the second mesh line MSH2-L extend, together with the edges MSH1-E and MSH2-E of the mesh patterns MSH1 and MSH2, the protective pattern SPT reduces the difference in reflectance from the cut part. Accordingly, the position having the cut part may be prevented from being specifically viewed from the outside by the user.

FIG. 10B illustrates that the cut part is defined in mesh patterns MSH1$a$ and MSH1$b$ of the same sensor pattern SP1 (or SP2; see FIG. 6) in one conductive pattern CPT2-1, which is different from that shown in FIG. 10A. As the cut part is formed in the mesh patterns MSH1$a$ and MSH1$b$ of one conductive pattern CPT2-1, the position having the cut part may be specifically viewed from the outside. As described above, the position having the cut part may be periodic or aperiodic.

In addition, as the protective pattern SPT (see FIG. 7B) is positioned at edges MSH1$a$-E and MSH1$b$-E of the mesh patterns MSH1$a$ and MSH1$b$ of the same conductive pattern CPT2-1, the difference in the reflectance between the cut part and the other parts is reduced, thereby preventing the position having the cut part from being specifically viewed by the user. The conductive pattern CPT2-1 is included in the 2-1 sensor conductive layer MTL2-1. and "In addition, as the protective pattern SPT (see FIG. 7B) is positioned at sides MSH1$a$-L and MSH1$b$-L of the mesh patterns MSH1$a$ and MSH1$b$ of the same conductive pattern CPT2-1, the difference in the reflectance between the cut part and the other parts is reduced, thereby preventing the position having the cut part from being specifically viewed by the user.

Although FIGS. 10A and 10B illustrate only the case of lowering the reflectance of the cut part in the mesh patterns MSH1, MSH2, MSH1$a$, and MSH1$b$, the protective pattern SPT (see FIG. 7B) is also provided in the end portion of the one mesh pattern MSH1, MSH2, MSH1$a$, or MSH1$b$. Accordingly, the reflectance is reduced in the end portion of the mesh pattern MSH1, MSH2, MSH1$a$, or MSH1$b$, thereby preventing the position having the end portion from being specifically viewed by the user.

FIGS. 11A to 11E are cross-sectional views sequentially illustrating some steps in a method for manufacturing an electronic device according to embodiments of the present disclosure. The same/similar reference numerals will be assigned to the same/similar components to components described with reference to FIGS. 1 to 10B and the redundant duplication may be omitted for economy of description.

According to an embodiment of the present disclosure, a method for manufacturing an electronic device may include forming a preliminary conductive pattern including a first to third layer sequentially formed on an insulating layer, forming an undercut in the second layer to form a conductive pattern having a tip part on the third layer, forming a preliminary protective pattern to cover the conductive pattern, and forming a protective pattern to cover a side surface of the second layer by removing at least a portion of the preliminary protective pattern.

The sensor conductive layer MTL (see FIG. 7B) including the formed conductive pattern CPT1 or CPT2 (see FIG. 7B) and the protective pattern SPT1 or SPT2 (see FIG. 7B) may correspond to a mesh pattern MSH1 or MSH2 (see FIG. 10A) described above with reference to FIGS. 10A and 10B.

Hereinafter, the manner for forming the sensor conductive layer including the conductive pattern and the protective pattern will be described with reference to FIGS. 11A to 11E.

For the convenience of explanation, the step of forming the first conductive pattern CPT1 (see FIG. 7B) and the first protective pattern (which is hereinafter referred to as protective pattern in short) SPT1 (see FIG. 7B) of the first sensor conductive layer MTL1 (see FIG. 7B) will be described. However, the following description is not necessarily limited only to the first sensor conductive layer MTL1 (see FIG. 7B), but may be similarly applied to the second sensor conductive layer MTL2 (see FIG. 7B).

Figure 11A:
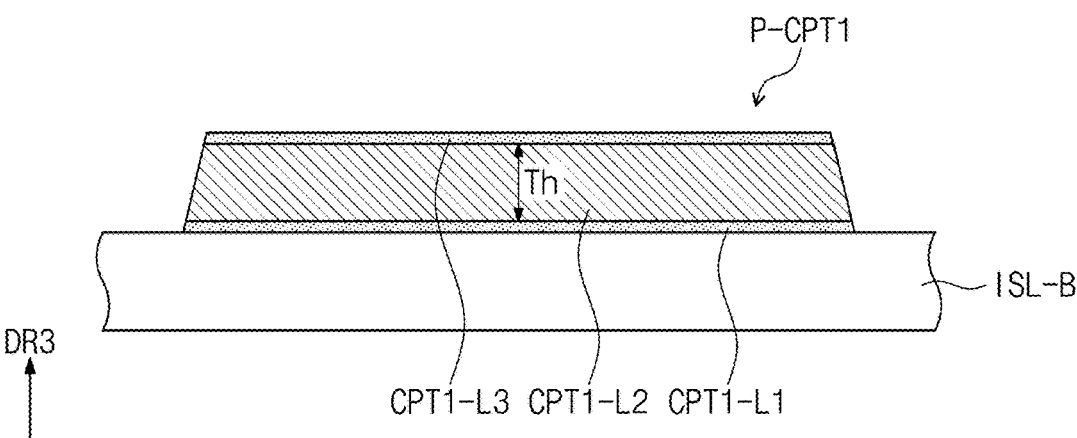
FIGS. 11A to 11E are cross-sectional views sequentially illustrating some of steps in a method for manufacturing an electronic device according to embodiments of the present disclosure.

Referring to FIG. 11A, according to an embodiment of the present disclosure, a preliminary conductive pattern P-CPT1 including the first layer CPT1-L1, the second layer CPT1-L2, and the third layer CPT1-L3 sequentially stacked (e.g., in the third direction DR3) may be formed on the first sensor insulating layers ISL-B. The layers of the preliminary conductive pattern P-CPT1 may be sequentially formed on the first sensor insulating layers ISL-B, and may be patterned. For example, the first layer CPT1-L1 and the third layer CPT1-L3 may include the same material as each other, and the second layer CPT1-L2 may include a material different from that of the third layer CPT1-L3. In an embodiment, the first layer CPT1-L1 and the third layer CPT1-L3 may include titanium (Ti) and the second layer CPT1-L2 may include aluminum (Al).

In this embodiment, the second layer CPT1-L2 may be formed on the first layer CPT1-L1 such that the thickness Th of the second layer CPT1-L2 may be greater than or equal to about 6000 Å.

Figure 11B:
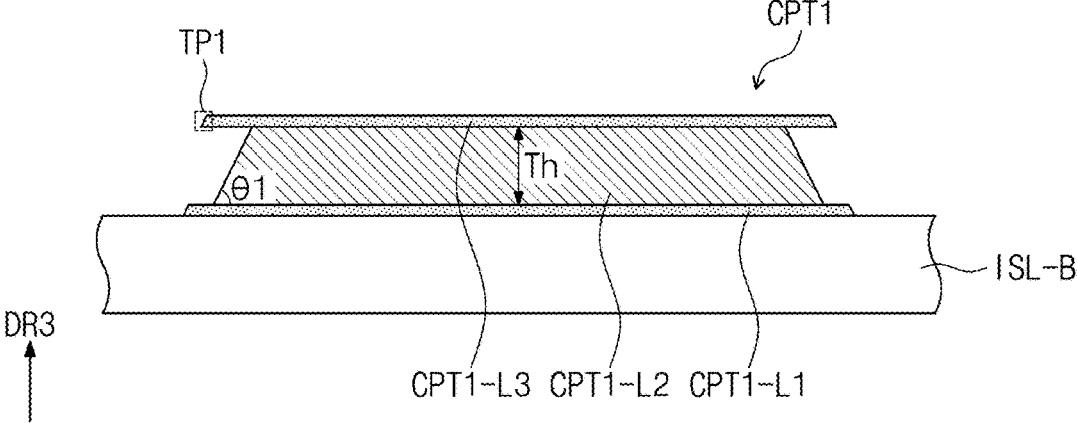

Referring to FIG. 11B, according to an embodiment of the present disclosure, the first conductive pattern CPT1 may be formed by etching the second layer CPT1-L2 such that the tip part TP1 is formed at the third layer CPT1-L3. In this embodiment, as the third layer CPT1-L3 remains instead of being etched, the tip part TP1 may be formed to protrude beyond the side surface of the second layer CPT1-L2.

According to an embodiment of the present disclosure, an etchant (e.g., tetramethylammonium hydroxide; TMAH) may be used when the second layer CPT1-L2 is etched, such that an undercut is formed in the second layer CPT1-L2 to form the tip part TP1 at the third layer CPT1-L3. Alternatively, the second layer CPT1-L2 may be exposed to a stripper for a sufficient amount of time in a strip process to provide an undercut in the second layer CPT1-L2. However, embodiments of the present disclosure are not necessarily limited thereto and various manners may be employed as long as the undercut is provided in the second layer CPT1-L2 such that the tip part TP1 is formed at the third layer CPT1-L3, in addition to the above-described manner.

In addition, the second layer CPT1-L2 may be etched in a tapered shape in which the width of the second layer CPT1-L2 is gradually narrowed as a distance from the first layer CPT1-L1 increases. In an embodiment, the tapered angle θ1 of the tapered shape formed in the second layer CPT1-L2 may be in a range of about 60 degrees to about 90 degrees.

Figure 11C:
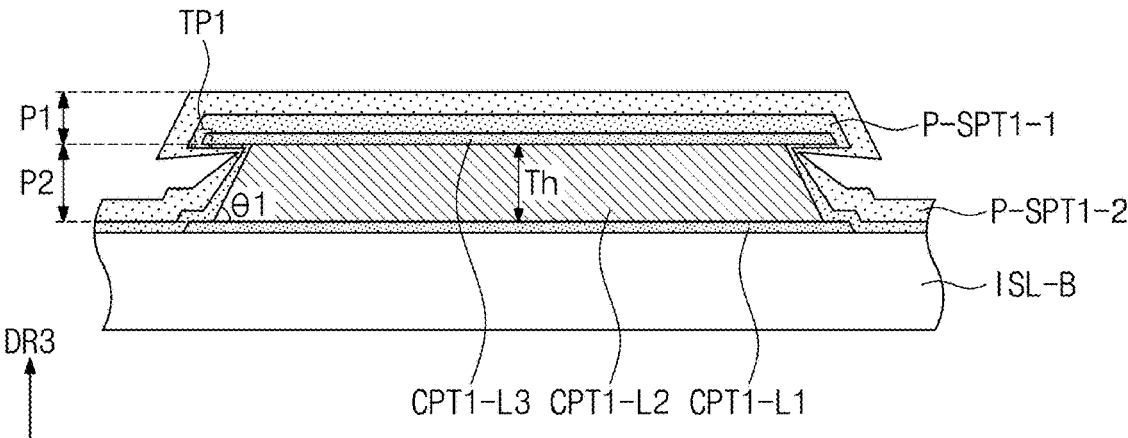

As the tapered angle θ1 of the second layer CPT1-L2 is in the range of about 60 degrees to about 90 degrees, when the preliminary protective patterns P-SPT1-1, and P-SPT1-2 (see FIG. 11C) are formed, a first part P1 (see FIG. 11C) of the preliminary protective patterns P-SPT1-1 and P-SPT1-2 (see FIG. 11C) may be easily disconnected from a second part P2 (see FIG. 11C) of the preliminary protective patterns P-SPT1-1 and P-SPT1-2 (see FIG. 11C).

In addition, when the protective pattern SPT1 (see FIG. 11E) is formed by removing at least a portion of the preliminary protective patterns P-SPT1-1, and P-SPT1-2 (FIG. 11C), as the tapered angle θ1 of the second layer CPT1-L2 is allowed to be in the range of about 60 degrees to about 90 degrees, in an embodiment in which an aniso-tropic etching process is used, a required etch selectivity may be secured.

Referring to FIG. 11C, according to an embodiment of the present disclosure, the preliminary protective patterns P-SPT1-1 and P-SPT1-2 may be formed to cover the first conductive pattern CPT1.

In an embodiment, in the step of forming the preliminary protective patterns P-SPT1-1 and P-SPT1-2, the first part P1, which covers the third layer CPT1-L3 of the first conductive pattern CPT1, of the preliminary protective patterns P-SPT1-1 and P-SPT1-2 may be disconnected from the second part P2, which covers the second layer CPT1-L2 of the first conductive pattern CPT1, of the preliminary pro-tective patterns P-SPT1-1 and P-SPT1-2, by the tip part TP1 of the third layer CPT1-L3.

As the first part P1 and the second part P2 are discon-nected from each other by the tip part TP1 of the third layer CPT1-L3, the entire portion of the first part P1 may be easily removed through the anisotropic etching process, and a portion of the second part P2 may remain in the step of forming the protective pattern SPT1 to be described later. Accordingly, the protective pattern SPT1 may be formed to cover the second layer CPT1-L2.

In the step of forming the preliminary protective patterns P-SPT1-1 and P-SPT1-2, the first preliminary protective pattern layer P-SPT1-1 to cover the first conductive pattern CPT1 may be formed, and then the second preliminary protective pattern layer P-SPT1-2 may be formed to cover the first preliminary protective pattern layer P-SPT1-1. The first preliminary protective pattern layer P-SPT1-1 may include a material having a reflectance that is less than a reflectance of a material of the second layer CPT1-L2 of the first conductive pattern CPT1. The second preliminary pro-tective pattern layer P-SPT1-2 may include a material dif-ferent from that of the first preliminary protective pattern layer P-SPT1-1.

For example, in an embodiment the first preliminary protective pattern layer P-SPT1-1 may include molybdenum and tantalum, and the second preliminary protective pattern layer P-SPT1-2 may include silicon oxide, silicon nitride, silicon oxynitride, or amorphous silicon. For example, in an embodiment the first preliminary protective pattern layer P-SPT1-1 may include a molybdenum tantalum oxide (MTO).

Thereafter, in the step of removing the portion of the preliminary protective patterns P-SPT1-1 and P-SPT1-2, as the second preliminary protective pattern layer P-SPT1-2 is etched earlier than the first preliminary protective pattern layer P-SPT1-1, at least a portion of the first preliminary protective pattern layer P-SPT1-1 may remain to cover the side surface of the second layer CPT1-L2.

Figure 11D:
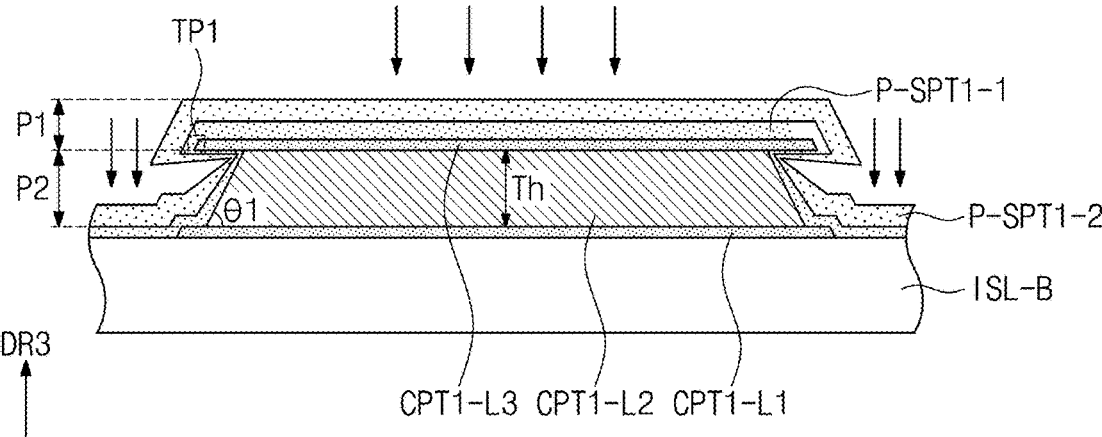
Figure 11E:
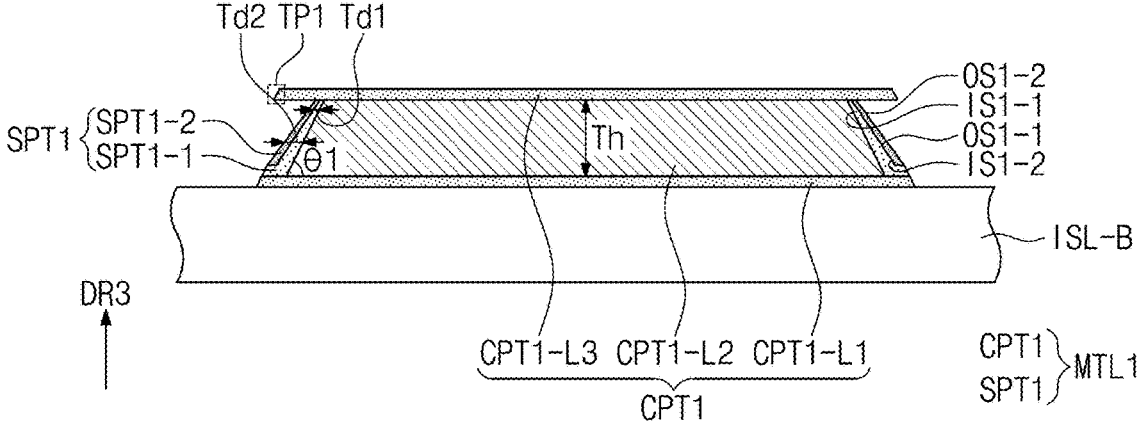

Referring to FIGS. 11D and 11E, according to embodi-ments of the present disclosure, the protective pattern SPT1 may be formed to cover the second layer CPT1-L2 by removing at least a portion of the preliminary protective patterns P-SPT1-1 and P-SPT1-2.

For example, in an embodiment the portions of the preliminary protective patterns P-SPT1-1 and P-SPT1-2 may be removed through anisotropic etching process to form the protective pattern SPT1. Accordingly, since the portions of the preliminary protective patterns P-SPT1-1 and P-SPT1-2 are removed through the anisotropic etching pro-cess to form the protective pattern SPT1, the protective pattern SPT1 may be irregular in thickness Td2 in a direction crossing the etching direction. For example, the protective pattern SPT1 may have the thickness Td2 that is irregular along the side surface of the second layer CPT1-L2 of the first conductive pattern CPT1.

In an embodiment, the first part P1 and the second part P2 of the preliminary protective patterns P-SPT1-1 and P-SPT1-2 may be disconnected from each other through the tip part TP1 of the third layer CPT1-L3 of the first conduc-tive pattern CPT1. As the first part P1 and the second part P2 are disconnected from each other through the tip part TP1 of the third layer CPT1-L3, when the portions of the prelimi-nary protective patterns P-SPT1-1 and P-SPT1-2 are removed through the anisotropic etching process, the por-tions of the preliminary protective patterns P-SPT1-1 and P-SPT1-2 may be easily removed while the first part P1 and the second part P2 are distinguished from each other.

In addition, as the tapered angle θ1 of the second layer CPT1-L2 of the first conductive pattern CPT1 having the tapered shape is provided in the range of about 60 degrees to about 90 degrees, an etch selectivity required to etch the second part P2 of the preliminary protective patterns P-SPT1-1 and P-SPT1-2 may be easily secured.

When the preliminary protective patterns P-SPT1-1 and P-SPT1-2 are subject to the anisotropic etching process, the portions of the preliminary protective patterns P-SPT1-1 and P-SPT1-2 may be blocked from being etched, by the tip part TP1 of the third layer CPT1-L3 of the first conductive pattern CPT1. In detail, a portion of the second part P2 of the preliminary protective patterns P-SPT1-1 and P-SPT1-2 may be covered by the tip part TP1 of the third layer CPT1-L3 of the first conductive pattern CPT1 and blocked from being etched. Accordingly, a portion of the preliminary protective patterns P-SPT1-1 and P-SPT1-2 which cover the side surface of the second layer CPT1-L2 of the first conductive pattern CPT1 may remain to form the protective pattern SPT1 to cover the side surface of the second layer CPT1-L2 of the first conductive pattern CPT1. In addition, the thickness Td1 of the first protective pattern layer SPT1-1 may be greater than or equal to about 300 Å.

According to an embodiment, the electronic device may prevent the viewing of a mesh pattern by the user.

According to an embodiment, the light may be prevented from being reflected from the side surface of the conductive pattern by disposing the protective pattern on the side surface of the conductive pattern.

According to an embodiment, the patterning of a protec-tive pattern may be provided without adding a mask by disconnecting the portion of the protective pattern by the tip part of the conductive pattern.

Although embodiments of the present disclosure have been described for illustrative purposes, those skilled in the art will appreciate that various modifications, and substitutions are possible, without departing from the scope and spirit of the present disclosure. Accordingly, the technical scope of embodiments of the present disclosure are not limited to the described embodiments.

While the present disclosure has been described with reference to embodiments thereof, it will be apparent to those of ordinary skill in the art that various changes and modifications may be made thereto without departing from the spirit and scope of the present disclosure.

What is claimed is:

1. An electronic device comprising:
a display panel; and
an input sensor including a first insulating layer directly contacting the display panel, a second insulating layer disposed on the first insulating layer, a first sensor electrode including a plurality of first sensor patterns and a plurality of first connection patterns connecting the plurality of first sensor patterns to each other, and a second sensor electrode including a plurality of second sensor patterns and a plurality of second connection patterns connecting the plurality of second sensor patterns to each other,
wherein the plurality of first connection patterns and the plurality of second connection patterns are arranged to be spaced apart from each other with the second insulating layer interposed between the plurality of first connection patterns and the plurality of second connection patterns,
wherein each of the first sensor electrode and the second sensor electrode includes a mesh pattern,
wherein the mesh pattern includes:
a first layer;
a second layer disposed on the first layer and having electrical conductivity,
a third layer disposed on the second layer, and having a tip part protruding beyond a side surface of the second layer in a cross-sectional view; and
a protective pattern covering the side surface of the second layer, and having an inner surface directly contacting the side surface of the second layer and an outer surface opposite to the inner surface, and
wherein the tip part and the outer surface of the protective pattern have an undercut shape in the cross-sectional view, the protective pattern exposing an entirety of a lowermost surface of the tip part.

2. The electronic device of claim 1, wherein the protective pattern has a reflectance that is less than a reflectance of the second layer.

3. The electronic device of claim 1, wherein the protective pattern includes:
a first protective pattern layer directly contacting the side surface of the second layer; and
a second protective pattern layer covering the first protective pattern layer, the second protective pattern layer including a material different from a material of the first protective pattern layer.

4. The electronic device of claim 3, wherein:
the first protective pattern layer includes molybdenum and tantalum; and
the second protective pattern layer includes silicon oxide, silicon nitride, silicon oxynitride, or amorphous silicon.

5. The electronic device of claim 3, wherein the first protective pattern layer has a minimum thickness value greater than or equal to about 300 Å.

6. The electronic device of claim 1, wherein the protective pattern has an uneven thickness along the side surface of the second layer.

7. The electronic device of claim 1, wherein:
the second layer has a tapered shape in the cross-sectional view, and
wherein a tapered angle of the second layer is in a range of about 60 degrees to about 90 degrees.

8. The electronic device of claim 1, wherein the first insulating layer includes silicon oxide or silicon nitride.

9. The electronic device of claim 1, wherein the plurality of first sensor patterns and the plurality of second sensor patterns are disposed on a same layer as the plurality of first connection patterns.

10. The electronic device of claim 1, wherein:
the plurality of first connection patterns are disposed on the second insulating layer; and
the plurality of second connection patterns are interposed between the first insulating layer and the second insulating layer.

11. The electronic device of claim 1, wherein the mesh pattern includes a plurality of mesh patterns,
wherein the plurality of mesh patterns include:
a first mesh pattern and a second mesh pattern spaced apart from each other in a plan view,
wherein the first mesh pattern and the second mesh pattern include edges defining a minimum distance between the first mesh pattern and the second mesh pattern, and
wherein a plurality of protective patterns are disposed on the edges.

12. The electronic device of claim 1, wherein:
the second layer includes aluminum (Al); and
wherein the third layer includes titanium (Ti).

13. An electronic device comprising:
a display panel; and
an input sensor including a first insulating layer directly contacting the display panel, a second insulating layer disposed on the first insulating layer, a first sensor electrode including a plurality of first sensor patterns and a plurality of first connection patterns connecting the plurality of first sensor patterns to each other, and a second sensor electrode including a plurality of second sensor patterns and a plurality of second connection patterns connecting the plurality of second sensor patterns to each other,
wherein the plurality of first connection patterns and the plurality of second connection patterns are arranged to be spaced apart from each other with the second insulating layer interposed between the plurality of first connection patterns and the plurality of second connection patterns,
wherein each of the first sensor electrode and the second sensor electrode includes a mesh pattern,
wherein the mesh pattern includes:
a first layer;
a second layer disposed on the first layer and having electrical conductivity,
a third layer disposed on the second layer and including a material different from a material of the second layer; and
a protective pattern covering a side surface of the second layer, and having an inner surface directly contacting the side surface of the second layer and an outer surface opposite to the inner surface, and
wherein the protective pattern includes:
a first protective pattern layer directly contacting the side surface of the second layer and having a reflectance less than a reflectance of the second layer; and

a second protective pattern layer covering the first protective pattern layer and having an uppermost surface co-planar with an uppermost surface of the first protective pattern layer, the second protective pattern layer including a material different from a material of the first protective pattern layer.

14. The electronic device of claim 13, wherein the third layer has a tip part protruding beyond the side surface of the second layer in a cross-sectional view, and wherein the tip part of the third layer and the outer surface of the protective pattern have an undercut shape in the cross-sectional view.

15. The electronic device of claim 13, wherein:
the second layer includes aluminum (Al); and
the third layer includes titanium (Ti).

16. The electronic device of claim 13, wherein:
the first protective pattern layer includes molybdenum and tantalum; and
the second protective pattern layer includes silicon oxide, silicon nitride, silicon oxynitride, or amorphous silicon.

17. The electronic device of claim 13, wherein the first protective pattern layer has a minimum width value greater than or equal to about 300 Å.

* * * * *